(12) United States Patent
Iwabuchi et al.

(10) Patent No.: US 8,742,526 B2
(45) Date of Patent: Jun. 3, 2014

(54) PHOTOELECTRIC CONVERSION DEVICE

(75) Inventors: Hiroyuki Iwabuchi, Sodegaura (JP);
Chishio Hosokawa, Sodegaura (JP);
Ryo Naraoka, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 113 days.

(21) Appl. No.: 13/388,359

(22) PCT Filed: Mar. 15, 2011

(86) PCT No.: PCT/JP2011/056019
§ 371 (c)(1),
(2), (4) Date: Feb. 1, 2012

(87) PCT Pub. No.: WO2011/115096
PCT Pub. Date: Sep. 22, 2011

(65) Prior Publication Data
US 2012/0126356 A1 May 24, 2012

(30) Foreign Application Priority Data
Mar. 15, 2010 (JP) ................................. 2010-058150

(51) Int. Cl.
*H01L 31/0232* (2006.01)
*H01L 31/0203* (2006.01)
*H01L 39/00* (2006.01)
*H01L 21/44* (2006.01)

(52) U.S. Cl.
USPC ........... 257/432; 257/433; 257/459; 257/661; 438/666; 438/667

(58) Field of Classification Search
USPC ........... 257/99, 100, 432, 433, 459, 735–736; 438/661, 666, 667
See application file for complete search history.

(56) References Cited

U.S. PATENT DOCUMENTS

2004/0207795 A1* 10/2004 Sakai et al. .................... 349/149
2007/0053202 A1*  3/2007 Sera et al. ..................... 362/559

FOREIGN PATENT DOCUMENTS

| JP | 8 241790 | 9/1996 |
| JP | 10 189250 | 7/1998 |
| JP | 2003 317938 | 11/2003 |
| JP | 2007 227094 | 9/2007 |
| JP | 2008 186618 | 8/2008 |
| WO | 2008 062645 | 5/2008 |

OTHER PUBLICATIONS

Machine Translation of JP 2008-186618 ("Nishimori").*
International Search Report Issued Apr. 26, 2011 in PCT/JP11/56019 Filed Mar. 15, 2011.

* cited by examiner

*Primary Examiner* — Kevin Parendo
(74) *Attorney, Agent, or Firm* — Oblon, Spivak, McClelland, Maier & Neustadt, L.L.P.

(57) ABSTRACT

A photoelectric conversion device including a substrate, a photoelectric conversion element including a first electrode, a second electrode and an organic compound layer and a sealing member that are disposed in this order. When a cross section of the photoelectric conversion device in a thickness direction is observed with the sealing member being placed at an upper side, a bonding member seals the organic compound layer at an outside thereof. An output electrode on the sealing member has a protrusion. A side conductive portion is electrically connected with the protrusion in an up-and-down direction. A substrate conductive member electrically connected with the first electrode and the second electrode extends to an outside of the bonding member. An electrical connecting member electrically connects the side conductive portion to the substrate conductive member at a further outside of the bonding member.

20 Claims, 24 Drawing Sheets

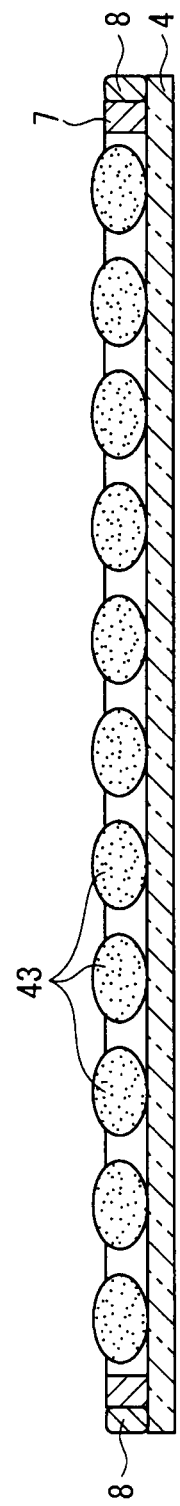

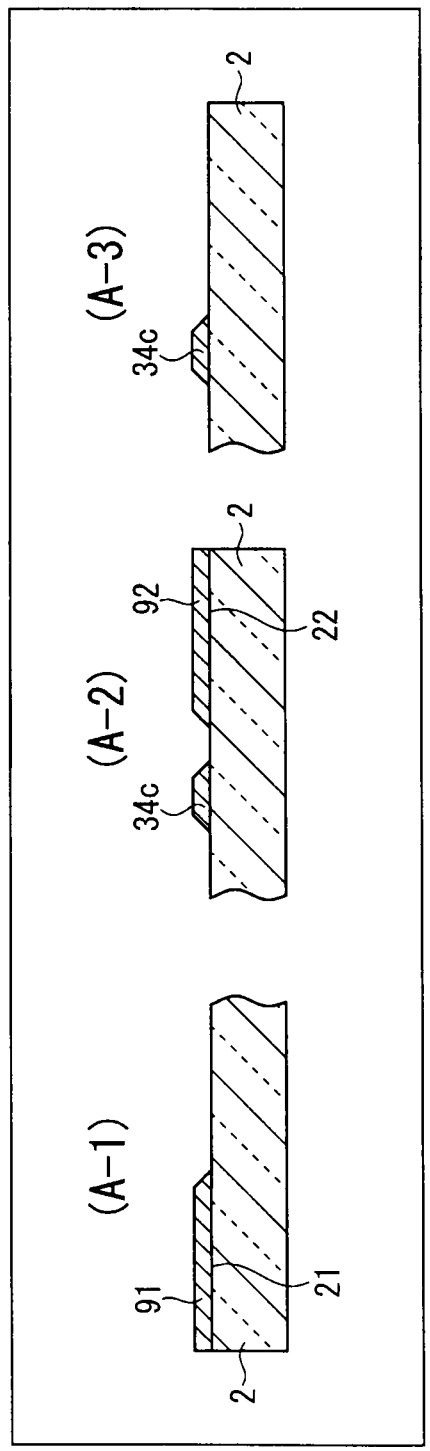

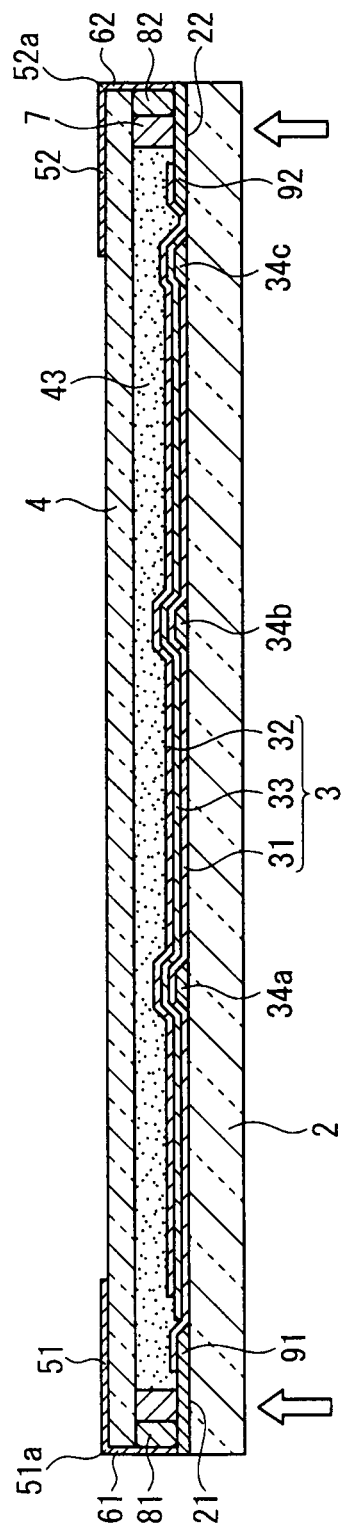

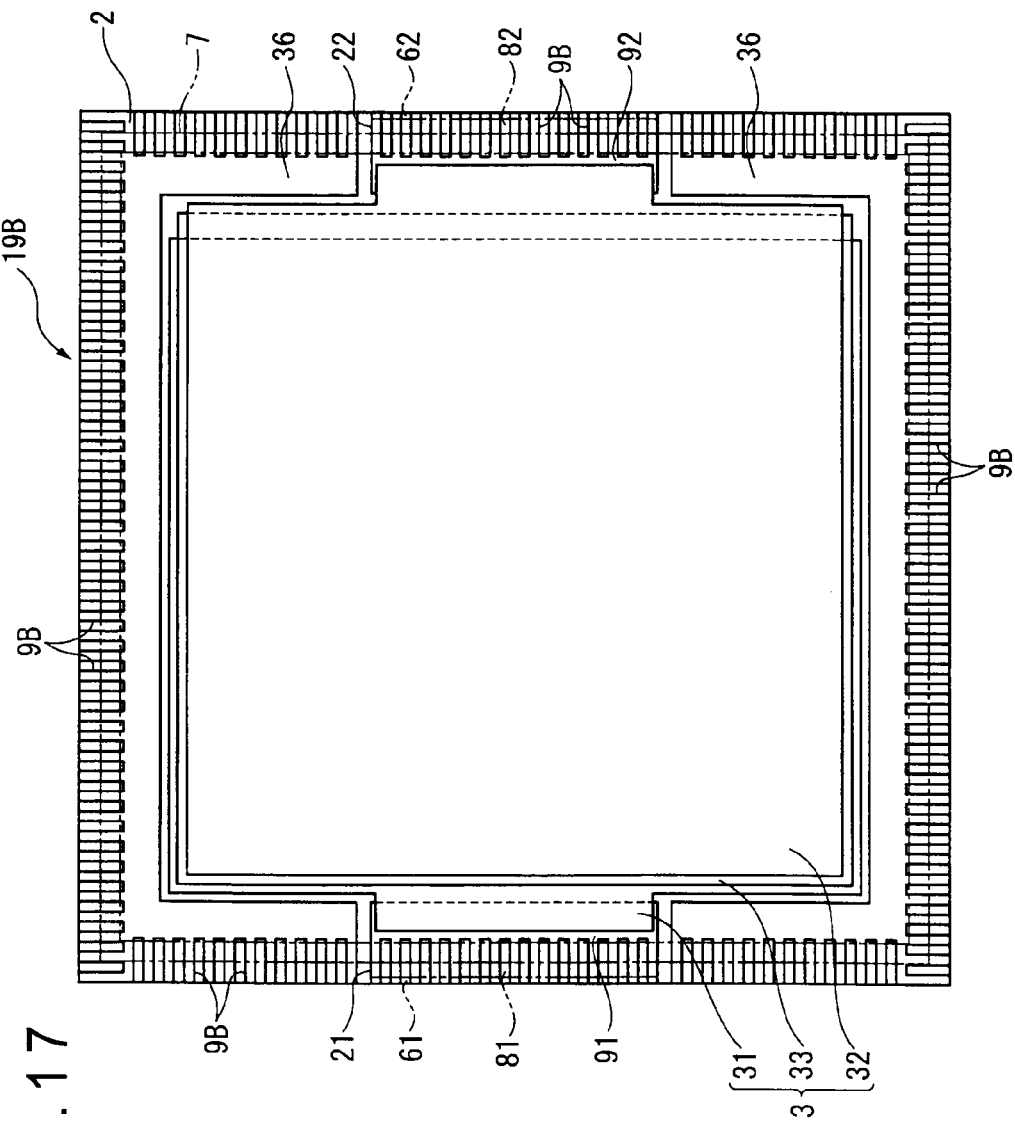

PHOTOELECTRIC CONVERSION DEVICE

TECHNICAL FIELD

The present invention relates to a photoelectric conversion device.

BACKGROUND ART

A photoelectric conversion device that has a photoelectric conversion element with an organic compound layer interposed between a pair of electrodes formed on a substrate has been proposed. Examples of the photoelectric conversion element include an organic electroluminescence device (referred to as organic EL device hereinafter) and an organic thin-film solar cell element. The organic EL device is an element for converting electricity to light. The organic thin-film solar cell element is an element for converting light into electricity.

Performance (e.g. element lifetime) of such a photoelectric conversion element is greatly influenced by water and air. Thus, a sealing structure for protecting the photoelectric conversion element from water and air has been studied.

For instance, an organic electroluminescence emitting device (referred to an organic EL emitting device hereinafter) disclosed in Patent Literature 1 for a display panel includes: a transparent substrate on which an organic electroluminescence emitting laminate (referred to as an organic EL emitting laminate hereinafter) is formed; a metal frame attached to a periphery of the transparent substrate; and a metal protection cover attached to the metal frame so as to cover the organic EL emitting laminate. The organic EL emitting device disclosed in Patent Literature 1 is electrically connected with an external device through a hole provided to the transparent substrate.

However, since the organic EL emitting device disclosed in Patent Literature 1 requires a number of portions to be bonded (e.g. between the transparent substrate and the metal frame and between the metal frame and the metal protection cover), it is likely that these portions are not sufficiently bonded, resulting in insufficient sealing of the organic EL emitting laminate.

Further, since an electrical connection terminal and an electrode of the organic EL emitting laminate are connected via the through-hole formed to the transparent substrate, a luminous area cannot be enlarged.

Patent Literature 1 also discloses another embodiment of an organic EL emitting device, in which the through-hole is not provided to the transparent substrate. In this embodiment, the electric connection terminal is exposed in a direction parallel to the surface of the transparent substrate. However, when a plurality of the organic EL emitting devices are to be mutually adjacently disposed in this embodiment, the electric connection terminals of the adjacent organic EL emitting devices interfere with each other. Thus, the organic EL emitting devices cannot be adjacently disposed with a narrow gap between the organic EL emitting devices.

In answer to the above disadvantages, Patent Literature 2 discloses a structure in which an output electrode and an organic EL device are electrically connected with each other through a connection spacer interposed therebetween. In Patent Literature 2, the output electrode extends from a surface (backside of a display panel) of a sealing plate opposite to a surface facing the organic EL device to a side face of the sealing plate and an end of the output electrode (an end near a transparent electrode) is bent inward to be extended to between the sealing plate and the connection spacer. The connection spacer is provided by electrically conductive microspheres coated with an electrically insulative resin and the like.

With the above structure, it is stated that, even when a plurality of display panels are adjacently disposed, joints between display panels become less recognizable.

CITATION LIST

Patent Literatures

Patent Literature 1: JP-A-2003-317938
Patent Literature 2: JP-A-08-241790

SUMMARY OF THE INVENTION

Problems to be Solved by the Invention

However, the technique disclosed in Patent Literature 2 relates to a connection of wiring of an organic EL device with an external output electrode in a simple-matrix or active matrix organic EL display panel. Such a technique is difficult to be directly applied to an electrical connection of a sheet-emitting organic EL illumination panel for illumination purpose and the like or to an organic thin-film solar cell panel having a large light-receiving surface.

Specifically, the amount of electricity required for driving a sheet-emitting organic EL device and the like is larger than that for driving an organic EL device used for a display panel. Thus, in a connection technique of a display panel using a connection spacer disclosed in Patent Literature 2, since an ITO pad connected with a signal electrode and the like or the output electrode is unstably contacted with the electrically conductive microspheres in the connection spacer at a small contact area, a stable electrical connection is difficult to be established in an organic EL illumination panel and the like that requires much current amount. Further, in the technique disclosed in Patent Literature 2, since the connection spacer is provided by the electrically conductive microspheres covered with the electrically insulative resin, a sealing function is deteriorated due to interaction between the electrically conductive microspheres and the electrically insulative resin.

In the technique disclosed in Patent Literature 1, it is likely that a sealing performance cannot be sufficiently exhibited, and the luminous area cannot be enlarged as described above. Further, since the electric connection terminal is exposed in a parallel (horizontal) direction via a hole penetrating through an insulative material bonding the metal frame and a non-permeable transparent board, the width of the bonding portion cannot be narrowed, so that a so-called "narrow bezel" structure in which luminous area accounts for a large portion of the device area is difficult to be provided.

An object of the invention is to provide a photoelectric conversion device that provides a sealing performance and a stable electrical connection to a photoelectric conversion element, the photoelectric conversion device having a narrow bezel structure in which joints between photoelectric conversion devices are less likely to be recognizable when a plurality of the photoelectric conversion devices are adjacently disposed.

Means for Solving the Problems

A photoelectric conversion device according to an aspect of the invention includes: a substrate; a photoelectric conversion element provided on the substrate; and a sealing member, the substrate, the photoelectric conversion element and the sealing member being layered in this order, in which; when a cross section of the photoelectric conversion device in a thickness direction is observed with the sealing member being placed above the substrate, the photoelectric conversion element is provided by layering a first electrode, an organic compound layer and a second electrode in this order in an upward direction; a bonding member for sealing the organic compound layer is provided outside the organic compound layer; one or more output electrodes are provided on the sealing member at a side opposite to a side near the photoelectric conversion element; at least one of the one or more output electrodes comprises a protrusion protruding outward beyond an end of the sealing member; a side conductive portion for establishing an electrical conduction with the protrusion in an up-and-down direction is provided on a side face of the photoelectric conversion device; a substrate conductive member is provided on the substrate, the substrate conductive member being electrically connected with at least one of the first electrode and the second electrode and extending under the bonding member to an outside of the bonding member; and an electrical connecting member that electrically connects the side conductive portion to the substrate conductive member is provided at the outside of the bonding member.

According to the above aspect of the invention, the bonding member provided outside the organic compound layer bonds the substrate with the sealing member and simultaneously seals the organic compound layer. Accordingly, a sealing performance and a bonding strength can be ensured in a narrow bezel structure in which an end of the substrate is used as a bonding portion.

Further, since the electrical connecting member is provided outside the bonding member and the side conductive portion and the substrate conductive member are electrically connected by the electrical connecting member, a stable electrical connection can be ensured.

Further, since the side conductive portion is electrically connected with the protrusion of the output electrode in the up-and-down direction, it is not necessary to extend the side conductive portion to an upper side of the output electrode for connection, so that a stable electrical connection can be established with a simple connection structure.

The electrical connection is established from the photoelectric conversion element to the output electrode via the substrate conductive member, the electrical connecting member and the side conductive portion, where the output electrode is situated in the thickness direction of the substrate. Accordingly, the space between the photoelectric conversion devices can be reduced, so that joints between the devices are less likely to be recognizable.

Incidentally, the term "photoelectric conversion device" in the invention refers to an apparatus for converting electric energy into light energy and an apparatus for converting light energy into electric energy.

The term "outside" represents an outside in a direction along the surface of the substrate.

In the photoelectric conversion device according to the above aspect of the invention, the side conductive portion is preferably provided outside an end of the sealing member, and the electrical connecting member is preferably provided inside the side conductive portion and outside the bonding member, the electrical connecting member being electrically connected with the substrate conductive member in the up-and-down direction and being electrically connected with the inside of the side conductive portion in a direction along a surface of the substrate.

According to the above arrangement, since the electrical connecting member is provided inside the side conductive portion and outside the bonding member, the electrical connecting member is well fitted in the photoelectric conversion device and does not spread out of the side conductive portion. Thus, even when a plurality of the photoelectric conversion devices are adjacently disposed, the interference between the electrical connecting members spread out of the substrate can be avoided, so that the photoelectric conversion devices can be disposed with small gaps and the joints between the photoelectric conversion devices are less likely to be recognizable.

Further, since the electrical connecting member is electrically connected with the substrate conductive member in the up-and-down direction and is electrically connected with an inside of the side conductive portion in a direction along the surface of the substrate, more stable electrical connection can be established.

In the photoelectric conversion device according to the above aspect of the invention, the at least one of the one or more output electrodes is preferably integrated with the side conductive portion.

According to the above arrangement, the side conductive portion and the output electrode can be provided by a single component. Since the number of the members required for extracting electricity from the photoelectric conversion element can be reduced, the structure and the production process of the photoelectric conversion element can be simplified.

For instance, by providing the member constituting the output electrode in an approximately L-shape, the output electrode and the side conductive portion can be integrated.

In the photoelectric conversion device according to the above aspect of the invention, the side conductive portion is preferably provided as a member independent of the at least one of the one or more output electrodes.

According to the above arrangement, since it is not necessary to bend the member for the output electrode at an end of the seal member to form the side conductive portion or to use a member that is bent in advance, electrical connection can be securely established even when the output electrode is provided by a member that is not easily bent.

Further, when the sealing member is thin, it is difficult to bend the member for the first and the second output electrodes near the end of the sealing member to form the side conductive portion. Thus, by providing the side conductive portion independent of the output electrode, a photoelectric conversion device with a thin sealing member can be easily produced.

In the photoelectric conversion device according to the above aspect of the invention, the side conductive portion is preferably provided outside an end of the sealing member, and the electrical connecting member is preferably provided between the substrate conductive member and the side conductive portion, the electrical connecting member being electrically connected with the substrate conductive member in the up-and-down direction and being electrically connected with the side conductive portion in the up-and-down direction.

According to the above arrangement, the side conductive portion is provided outside the end of the sealing member. The electrical connecting member is electrically connected with the substrate conductive member in the up-and-down direction and is electrically connected with the side conductive portion in the up-and-down direction. Accordingly, the electrical connecting member can be provided near an end of the substrate.

Then, as compared with an arrangement in which an electrical connection is established in a direction along a surface of the substrate, the bonding member can be provided near the end of the substrate and inside the electrical connecting member. Thus, the space on the substrate for disposing the photoelectric conversion element can be further widened. For instance, when the photoelectric conversion element is an organic EL device, the luminous area can be increased. When the photoelectric conversion element is a solar cell element, a light-receiving area can be increased.

A photoelectric conversion device according to another aspect of the invention includes: a substrate; a photoelectric conversion element provided on the substrate; and a sealing member, the substrate, the photoelectric conversion element and the sealing member being layered in this order, in which, when a cross section of the photoelectric conversion device in a thickness direction is observed with the sealing member being placed above the substrate, the photoelectric conversion element is provided by layering a first electrode, an organic compound layer and a second electrode in this order in an upward direction, a bonding member for sealing the organic compound layer is provided outside the organic compound layer, one or more output electrode are provided on the sealing member at a side opposite to a side near the photoelectric conversion element, at least one of the one or more output electrode comprises a protrusion protruding outward beyond an end of the sealing member, a side conductive portion for establishing an electrical conduction with the protrusion in an up-and-down direction is provided on a side face of the photoelectric conversion device, a substrate conductive member is provided on the substrate, the substrate conductive member being electrically connected with at least one of the first electrode and the second electrode and extending under the bonding member to an outside of the bonding member, and the side conductive portion is electrically connected with the substrate conductive member in the up-and-down direction at the outside of the bonding member.

According to the above aspect of the invention, the bonding member provided outside the organic compound layer bonds the substrate with the sealing member and simultaneously seals the organic compound layer. Accordingly, a sealing performance and a bonding strength can be ensured in a narrow bezel structure in which the end of the substrate is used as a bonding portion.

Further, since the output electrode and the substrate conductive member are electrically connected by the side conductive portion outside the bonding member, a stable electrical coupling can be ensured.

Further, since an electrical connection with the protrusion of the output electrode in the up-and-down direction is established by the side conductive portion, it is not necessary to extend the side conductive portion to an upper side of the output electrode for connection, so that a stable electrical connection can be established with a simple connection structure.

The electrical connection is established from the photoelectric conversion element to the output electrode via the substrate conductive member, the electrical connecting member and the side conductive portion, where the output electrode is situated in the thickness direction of the substrate. Accordingly, the space between the photoelectric conversion devices can be reduced and joints between the devices are less likely to be recognizable.

Further, since the side conductive portion is electrically connected with the substrate conductive member in the up-and-down direction and is electrically connected with the protrusion of the output electrode in the up-and-down direction, as compared with an instance in which the electrical connection is established in a direction along the surface of the substrate, the bonding member can be provided near the end of the substrate and inside the side conductive portion. Thus, the space on the substrate for disposing the photoelectric conversion element can be further widened.

In the photoelectric conversion device according to the above aspect of the invention, at least one of the first electrode and the second electrode is preferably integrated with the substrate conductive member.

According to the above arrangement, since the substrate conductive member and the at least one of the first and the second electrodes are integrated, the substrate conductive member can be formed simultaneously with the formation of the at least one of the first and the second electrodes, so that the structure and the production process of the photoelectric conversion device can be simplified.

In the photoelectric conversion device according to the above aspect of the invention, the sealing member is provided by an electrically conductive member, and an insulative portion is provided between the sealing member and the at least one of the one or more output electrodes.

According to the above arrangement, since the one of the output electrodes that is not provided with the insulative portion can be electrically connected with the sealing member provided by an electrically conductive member, the sealing member can also be used as the output electrode. Consequently, the position for attaching the wirings for electrically connecting with an external power source and the like can be located more freely.

In the photoelectric conversion device according to the above aspect of the invention, an insulation film is preferably formed on the substrate conductive member.

According to the above arrangement, the short circuit of the first and the second electrodes through the substrate conductive portion can be avoided. For instance, when the second electrode is formed over the substrate conductive member that is electrically connected with the first electrode, since the insulative film is formed on the substrate conductive member, the electrical connection between the second electrode and the substrate conductive member and, consequently, the short circuit of the first and the second electrodes through the substrate conductive portion can be prevented.

In the photoelectric conversion device according to the above aspect of the invention, a light-reflecting portion is preferably provided on the substrate at a region different from a region at which the substrate conductive member and the photoelectric conversion element are provided.

According to the above arrangement, since the light-reflecting portion is formed on the substrate at a region different from the region at which the substrate conductive member and the photoelectric conversion element are formed, the light emitted from the photoelectric conversion element such as an organic EL device and propagated to a bonding portion provided near the end of the substrate at which the substrate conductive member and the photoelectric conversion element are not formed is reflected by the light-reflecting portion to be emitted in the light-extraction direction. Thus, since the bonding portion is hid by the light, the joints between the photoelectric conversion devices and the bonding portion are less likely to be recognizable when a plurality of the photoelectric conversion devices are adjacently provided.

Incidentally, the light-reflecting portion is provided by a light-reflecting material and is capable of reflecting the light generated, for instance, in the organic compound layer in the light-extraction direction of the photoelectric conversion device.

In the photoelectric conversion device according to the above aspect of the invention, the light-reflecting portion is preferably integrated with the substrate conductive member.

According to the above arrangement, since the area of the light-reflecting portion can be made as large as possible on the substrate, the light reflection in the light-extraction direction of the photoelectric conversion device can be further efficiently performed.

BRIEF DESCRIPTION OF DRAWINGS

FIG. 6C schematically illustrates still another production step of the component including the sealing member of the photoelectric conversion device according to the first exemplary embodiment.

FIG. 7A schematically illustrates a production step of a component including a substrate of the photoelectric conversion device according to the first exemplary embodiment.

FIG. 8C schematically illustrates still another adhesion step of the photoelectric conversion device according to the first exemplary embodiment.

FIG. 17 is a plan view of a cross section showing a photoelectric conversion device according to a ninth exemplary embodiment of the invention.

DESCRIPTION OF EMBODIMENTS

A first exemplary embodiment of the invention will be described below with reference to the attached drawings.
Photoelectric Conversion Device FIG. 1 is a perspective view showing an entirety of a photoelectric conversion device according to the first exemplary embodiment.

Figure 1:
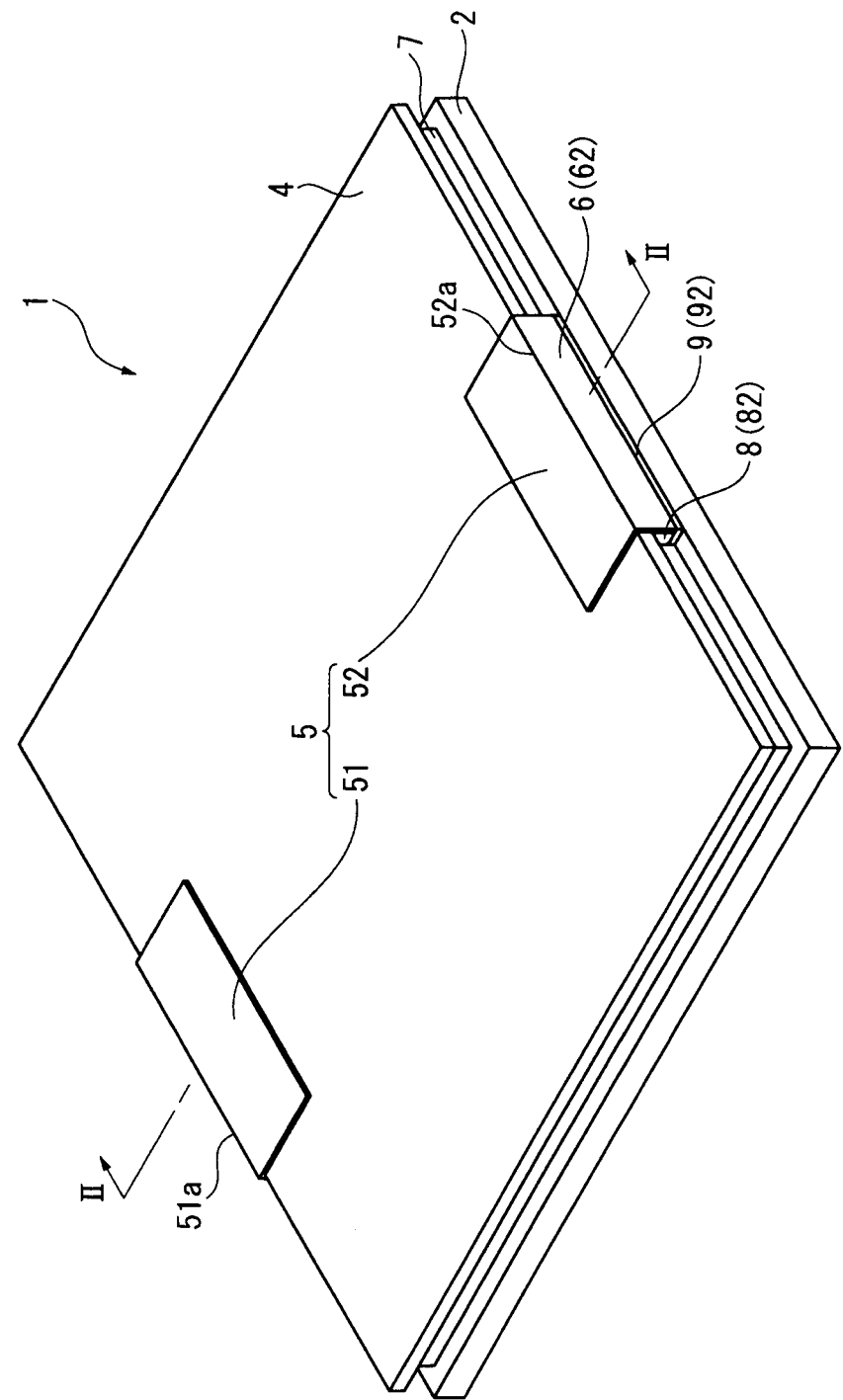
FIG. 1 is a perspective view showing a photoelectric conversion device according to a first exemplary embodiment of the invention.
Figure 2:
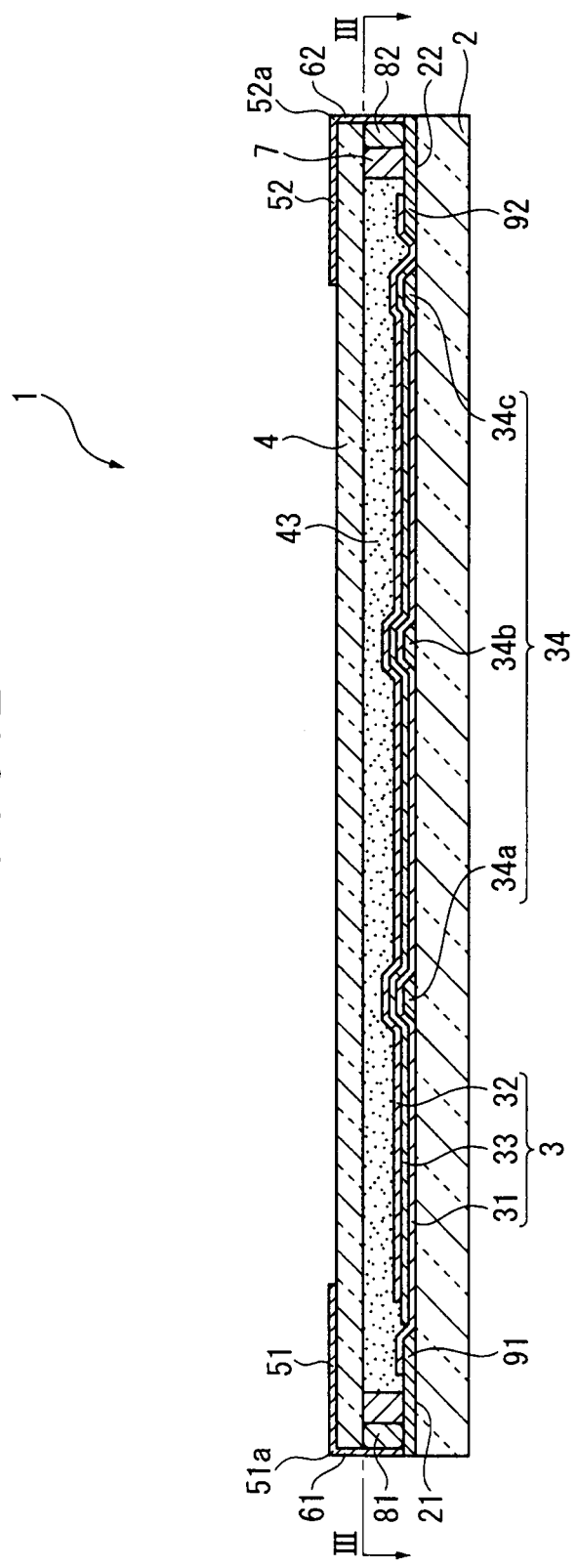
FIG. 2 is a vertical cross section taken along II-II line direction in FIG. 1.

FIG. 2 is a vertical cross section taken along II-II line direction in FIG. 1.

Figure 3:
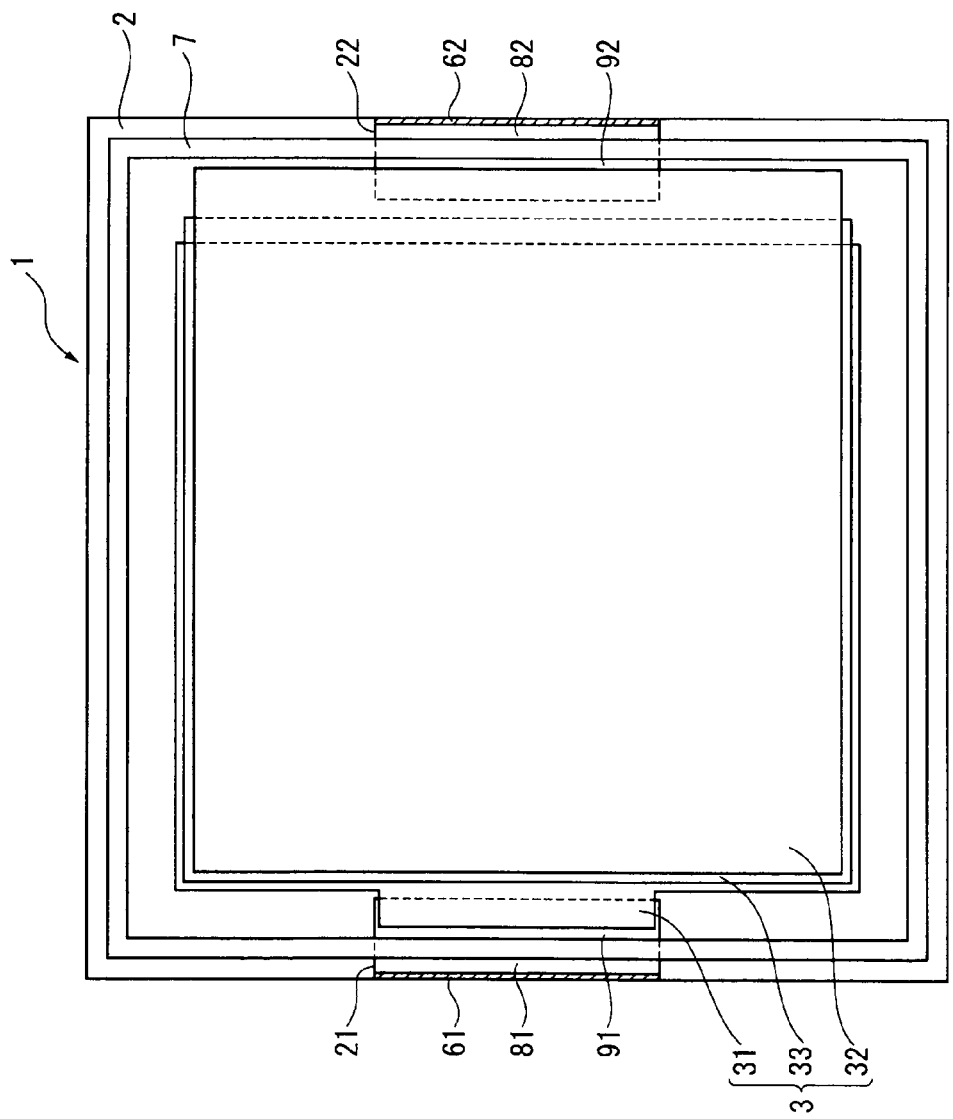
FIG. 3 is a plan view of a cross section taken along line III-III in FIG. 2.

FIG. 3 is a plan view of a cross section taken along line III-III in FIG. 2.

A photoelectric conversion device 1 includes: a substrate 2, a photoelectric conversion element 3 provided on the substrate 2, a sealing member 4 provided above the substrate 2 in a manner facing the substrate 2, an output electrode 5 provided to a first surface of the sealing member 4 opposite to a second surface of the sealing member 4 facing the photoelectric conversion element 3, a side conductive portion 6 that is electrically connected with the output electrode 5, a bonding member 7 provided to an outside of the photoelectric conversion element 3 and bonding the substrate 2 to the sealing member 4, a substrate conductive member 9 that is electrically connected with the photoelectric conversion element 3 and extends to an outside of the bonding member 7, and an electrical connecting member 8 that is provided at a portion closer to an end of the substrate 2 than the bonding member 7 and electrically connects the side conductive portion 6 with the substrate conductive member 9. An instance in which the photoelectric conversion element 3 is provided by an organic EL device 3 will be described in this exemplary embodiment.

Incidentally, FIG. 2 is also a cross section in a thickness direction of the photoelectric conversion device 1 when the sealing member 4 is placed above the substrate 2. FIG. 3 is also a plan view (seen facing the substrate 2) of a cross section of the photoelectric conversion device 1 taken in a direction along a surface of the substrate 2. FIGS. 2 and 3 are for illustrating an electrical connection (described below) between the photoelectric conversion element (organic EL device) 3 and the output electrode 5.
Substrate The substrate 2 is a flat smooth plate member for supporting the organic EL device 3 (photoelectric conversion element 3). When the light is extracted through the substrate 2, the substrate 2 is preferably provided by a light-transmissive member having transmissivity of transmits 50% or more of light in a visible region of 400 nm to 700 nm. The light-transmissive plate is exemplarily a sheet glass, a polymer plate or the like. For the sheet glass, such materials as soda-lime glass, barium/strontium-containing glass, lead glass, aluminosilicate glass, borosilicate glass, barium borosilicate glass, quartz and the like can be used. For the polymer plate, materials such as polycarbonate resins, acryl resins, polyethylene terephthalate resins, polyether sulfide resins and polysulfone resins can be used. In this exemplary embodiment, the substrate 2 is provided by a light-transmissive substrate and the light from the organic EL device 3 is extracted through the side of the substrate 2.

On the other hand, when the light is extracted in a direction opposite to the substrate 2, the substrate 2 may be provided by an opaque substrate such as a silicon substrate and metal substrate in addition to the above light-transmissive substrate 2.

An end of the substrate 2 at which an electricity output occurs from an anode 31 of the organic EL device 3 is a connecting portion 21. Another end of the substrate 2 at which electricity output occurs from a cathode 32 of the organic EL device 3 is a connecting portion 22.

When a plurality of the photoelectric conversion devices 1 are adjacently disposed, the substrate 2 may be provided by a plate member of 100 mm×100 mm×0.7 mm (height×width× thickness). The substrate 2 may be provided by cutting a large-size plate member into a predetermined size.

Organic EL Device

As shown in FIG. 2, the organic EL device 3 includes the anode 31 (first electrode 31) provided on the substrate 2, the cathode 32 (second electrode 32) provided at a position opposing to the anode 31 and an organic compound layer 33 provided between the anode 31 and the cathode 32. The organic EL device 3 is provided by laminating the substrate 2, the anode 31, the organic compound layer 33 and the cathode 32 in this order toward the top of the surface. The organic EL device 3 may alternatively be provided by arranging the first electrode 31 as a cathode and the second electrode 32 as an anode.

The organic compound layer 33 may be provided by a single emitting layer or, alternatively, by various intermediate layers interposed between the anode 31 and the emitting layer and/or between the cathode 32 and the emitting layer. The intermediate layer exemplarily includes a hole injecting layer, a hole transporting layer, an electron injecting layer and an electron transporting layer. These layers are provided by various known organic and inorganic compounds. However, the organic compound layer 33 of this exemplary embodiment refers to a layer including at least one layer provided by an organic compound.

The emitting layer, which is formed of known emitting materials such as $Alq_3$, provides a single-color emission (e.g. red, green, blue or yellow emission), and combined-color emission of red, green, blue and yellow emission (e.g., white-color emission). In forming the emitting layer, a doping method, according to which an emitting material (dopant) is doped to a host, has been known as a usable method. The emitting layer formed by the doping method can efficiently generate excitons from electric charges injected into the host. With the exciton energy generated by the excitons being transferred to the dopant, the dopant can emit light with high efficiency.

Known electrode materials are used for the anode 31. Examples of the electrode materials include transparent electrode materials such as ITO (indium tin oxide), IZO (registered tradename) (indium zinc oxide) and ZnO (zinc oxide) when the light is to be extracted through the substrate 2.

Known electrode materials are used for the cathode 32. Examples of the electrode material include metal such as Ag and Al and alloy thereof when the light is to be extracted through the substrate 2.

Incidentally, when the light is extracted in a direction opposite to the substrate 2, the anode 31 may be provided by metal, alloy and the like and the cathode 32 is provided by a transparent electrode material.

As shown in FIG. 2, a plurality of auxiliary electrodes 34 (34a, 34b, 34b) are formed on the substrate 2. The auxiliary electrodes 34 are provided in order to prevent a voltage reduction due to an electric resistance of the transparent electrode material used for the anode 31 so that the voltage is uniformly applied to the entirety of the anode 31 and the organic EL device 3 evenly emits light.

The auxiliary electrodes 34 are formed in lines between the substrate 2 and the anode 31. In this exemplary embodiment, the auxiliary electrodes 34 extend in a direction perpendicular to a plane of FIG. 2. The auxiliary electrodes 34 are electrically connected with each other at position(s) not illustrated.

Known electrode materials are used for the auxiliary electrode 34. Examples of the electrode materials include metal such as Cu, Ag and Al and alloy thereof.

Substrate Conductive Member

As shown in FIG. 2, the substrate conductive member 9 includes a first substrate conductive member 91 electrically connected with the anode 31 of the organic EL device 3 and a second substrate conductive member 92 electrically connected with the cathode 32, both provided on the substrate 2.

The first substrate conductive member 91 is connected with an end of the anode 31 and is extended from the connection to an end of the connecting portion 21 of the substrate 2 (i.e. the left side in FIG. 2). In the course, the first substrate conductive member 91 passes under the bonding member 7 and the electrical connecting member 8 (below-described electrical connecting member 81) More specifically, the first substrate conductive member 91 passes between the bonding member 7 and the substrate 2 and between the electrical connecting member 8 and the substrate 2.

The second substrate conductive member 92 is connected with an end of the cathode 32 and is extended from the connection to an end near the connecting portion 22 of the substrate 2 (i.e. the right side in FIG. 2). In the course, the second substrate conductive member 92 passes under the bonding member 7 and the electrical connecting member 8 (below-described electrical connecting member 82) More specifically, the second substrate conductive member 92 passes between the bonding member 7 and the substrate 2 and between the electrical connecting member 8 and the substrate 2.

Known electrode materials are used for the substrate conductive member 9. Examples of the electrode materials include metal such as Cu, Ag and Al and alloy thereof. The substrate conductive member 9 may be provided by the same material as that of the anode 31 and the cathode 32.

As shown in FIG. 3, the substrate conductive member 9 has a width (a dimension in a direction substantially orthogonal to a direction in which the substrate conductive member 9 is connected with the anode 31 and the cathode 32) of an approximately one fourth to one third of a length of a side of the substrate (in a plan view). The width of the substrate conductive member is determined according to the amount of the current required for the device. The substrate conductive member 9 is connected to the auxiliary electrode 34 (not shown). Thus, similarly to a display device having electrodes arranged in a matrix, a stable electrical connection can also be ensured even when much amount of the current is required for driving the organic EL device 3 for an illumination unit in which the electrodes are arranged in a sheet.

Figure 4:
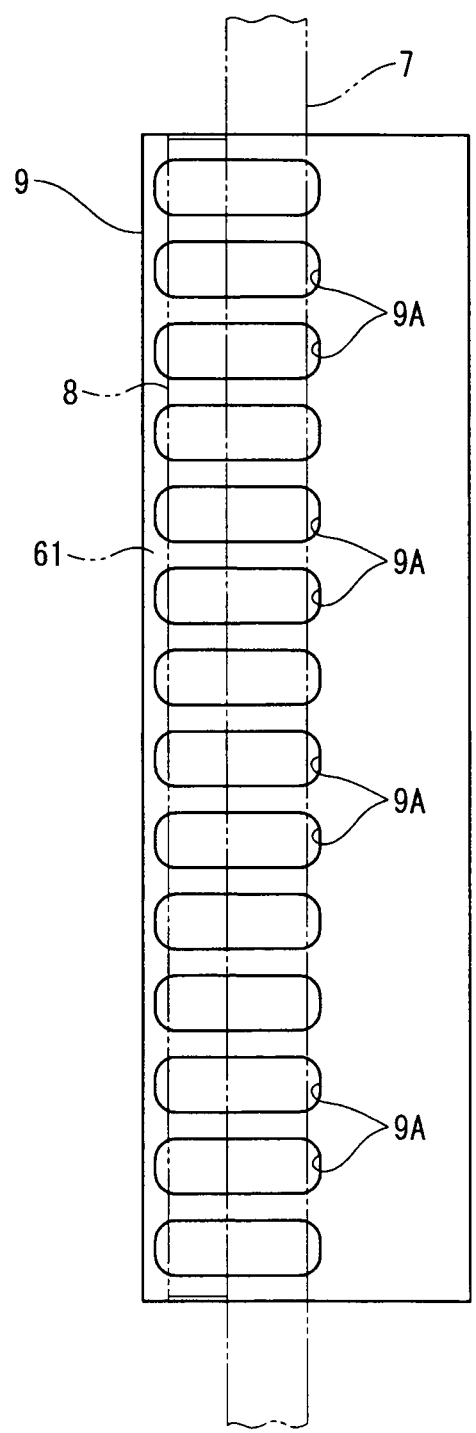
FIG. 4 is a plan view of a substrate conductive member of the photoelectric conversion device.

FIG. 4 is a plan view showing the substrate conductive member 9, in which the first substrate conductive member 91 in FIG. 3 is specifically illustrated. Thus, the left long side of the substrate conductive member 91 (in a plan view) formed in an approximately rectangular shape actually extends along an end of the substrate 2. As shown in FIG. 4, a plurality of holes 9A are arranged in parallel along the left long side of the substrate conductive member 9. The plurality of holes 9A are provided at positions at which the bonding member 7 and the electrical connecting member 8 (described below: shown in two-dot chain lines in FIG. 4) are provided. The plurality of holes 9A are formed to stretch over the bonding member 7 and the electrical connecting member 8. Though only the substrate conductive member 91 is illustrated and the substrate conductive member 92 is not illustrated herein, the substrate conductive member 92 also has similar holes formed thereon.

The holes 9A can exemplarily be formed by mask-sputtering.

The holes 9A are necessary for heating and melting the bonding member 7 and the electrical connecting member 8 by laser radiation for bonding and electrically connecting during the production process of the photoelectric conversion device 1. Without the holes 9A on the substrate conductive member 9, even when a laser light is radiated through the side of the substrate 2, the heat generated by the laser radiation is absorbed by the substrate conductive member 9, so that the bonding member 7 and the electrical connecting member 8 are not sufficiently heated, thus failing to melt the bonding member 7 and the electrical connecting member 8. However, the presence of the holes 9A allows the laser to pass through the holes 9A to reach the bonding member 7 and the electrical connecting member 8, so that the bonding member 7 and the electrical connecting member 8 are smoothly heated and melted, thus allowing the bonding and electrical connection. Especially, since the bonding member 7 is melted to be bonded to the substrate 2, the sealing performance is enhanced.

Incidentally, the holes 9A are not illustrated in the substrate conductive member 9 in the other figures.

An internal insulation film (insulation film) may be formed on the substrate conductive member 9. The internal insulation film prevents short circuit between the cathode 32 and the substrate conductive member 91 even when the cathode 32 is formed partially overlapping with the substrate conductive member 91.

The internal insulation film may also be formed on the auxiliary electrode 34. In this case, the internal insulation film is formed on one of the auxiliary electrodes 34 adjoining an end of the anode 31, which is preferably an auxiliary electrode 34c shown in FIG. 2. The formation of the internal insulation film prevents the short circuit between the cathode 32 and the auxiliary electrode 34c.

The internal insulation film may not be formed all over the substrate conductive member 9 or the auxiliary electrode 34 but may be formed in an area necessary for preventing a short circuit. The internal insulation film may be formed on a part of the substrate conductive member 9 or the auxiliary electrode 34.

The internal insulation film may be formed with an electrically insulative material. The internal insulation film may be formed by a mask evaporation, mask sputtering and the like using silicon oxide ($SiO_2$), aluminum oxide and the like. The internal insulation film is preferably formed after the formation of the anode 31. The internal insulation film may be formed at any position as long as the internal insulation film can prevent the short circuit of the anode 31 or the cathode 32 with the substrate conductive member 9 or the auxiliary electrode 34 and the internal insulation film does not cover a portion of the substrate conductive member 9 to be connected with the electrical connecting member 8.

Figure 5:
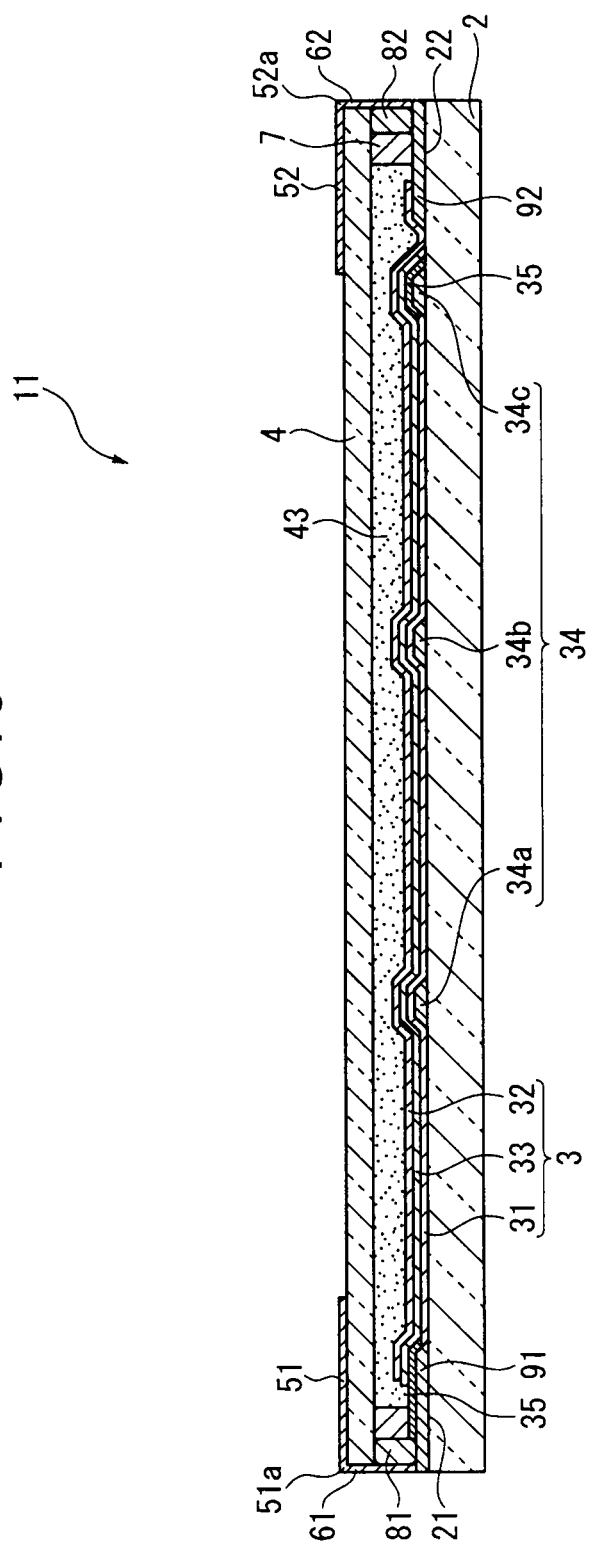
FIG. 5 is a vertical cross section showing an example of a photoelectric conversion device having an insulation film on the substrate conductive member.

A modification of the photoelectric conversion device 1 in which an internal insulation film 35 is formed is illustrated in FIG. 5.

FIG. 5 is a cross section in a thickness direction of a photoelectric conversion device 11 with the sealing member 4 placed above the substrate 2, in which the internal insulation film 35 is formed on the substrate conductive member 91 and the auxiliary electrode 34c.

The photoelectric conversion device 11 has substantially the same arrangement as that of the photoelectric conversion device 1 except for the internal insulation film 35 and the shape of the anode 31, the cathode 32 and an end of the organic compound layer 33.

The cathode 32 further extends over a part of the connecting portion 21 of the substrate 2 (left side in FIG. 5) as compared with the photoelectric conversion device 1 and is overlapped with the substrate conductive member 91. However, since the internal insulation film 35 is formed on the substrate conductive member 91, the cathode 32 and the substrate conductive member 91 are electrically insulated by the internal insulation film 35 interposed between the substrate conductive member 91 and the cathode 32.

Further, the cathode 32 extends over a part of the connecting portion 22 of the substrate 2 (right side in FIG. 5). In other words, the cathode 32 is formed over the auxiliary electrode 34c and is further formed to be overlapped with the substrate conductive member 92. The organic compound layer 33 is formed over the auxiliary electrode 34c so that the organic compound layer 33 is interposed between the auxiliary electrode 34c and the cathode 32. If the organic compound layer 33 is not extended to go beyond the auxiliary electrode 34c, the cathode 32 and the auxiliary electrode 34c may be electrically connected to cause a short circuit between the cathode 32 and the anode 31. However, since the internal insulation film 35 is formed on the auxiliary electrode 34c, the internal insulation film 35 is interposed between the auxiliary electrode 34c and the cathode 32 and the cathode 32 and the substrate conductive member 92 are electrically insulated.

Incidentally, when the anode 31 is extended to the substrate conductive member 92 to be electrically connected, the short circuit between the anode 31 and the cathode 32 can be avoided by forming the internal insulation film 35 on the substrate conductive member 92 in the same manner as the above.

Sealing Member

The sealing member 4 is one of members for sealing the organic EL device 3. As shown in FIG. 2, the sealing member 4 is placed at an upper side of the organic EL device 3 opposing the substrate 2.

The organic EL device 3 is sealed as follows. Initially, the substrate 2 is placed at a lower side of the organic EL device 3 and the sealing member 4 is placed at an upper side of the organic EL device 3. Then, the bonding member 7 is provided outside the organic compound layer 33 of the organic EL device 3 in the cross section in a thickness direction of the photoelectric conversion device 1 as shown in FIG. 2. Also, the bonding member 7 surrounds the organic compound layer 33 in a frame shape in a cross section of the photoelectric conversion device 1 taken along a surface of the substrate 2 as shown in FIG. 3. The organic EL device 3 is sealed by bonding the substrate 2 and the sealing member 4 with the bonding member 7.

The sealing member 4 is preferably a plate, a film or a foil member. Specifically, a sheet glass, a polymer plate, a film, a metal plate and a metal foil and the like may be employed. Incidentally, though the sealing member 4 is a plate-shaped member in this exemplary embodiment, the sealing member 4 may exemplarily be a cap, a plate (e.g. a board with a recess on one side), a sheet or a film having a recess of which inner dimension is larger than an outer dimension of the organic EL device 3.

The size of the sealing member 4 is preferably the same as or smaller than that of the substrate 2. Further, in order to secure a space for providing the side conductive portion 6 at an end surface of the sealing member 4, when the photoelectric conversion device 1 is seen in a plan view, the sealing member 4 is preferably sized to be offset inward relative to the end of the substrate 2 by a dimension equal to or slightly larger than a thickness of the side conductive portion 6 while being bonded to the substrate 2. Incidentally, the entirety of the sealing member 4 is not necessarily offset but it may be sufficient to offset a part of the sealing member 4 corresponding to the connecting portions 21 and 22 of the substrate 2 when the substrate 2 and the sealing member 4 are bonded may only be offset.

The thickness of the sealing member 4 is preferably in a range from 0.1 mm to 5 mm. When the thickness is less than 0.1 mm, air permeability is increased to decrease the sealing performance.

Output Electrode

The output electrode 5 is an electrode for electrically taking out the electrodes 31 and 32 of the photoelectric conversion element 3 sealed inside the photoelectric conversion device 1 to an outside of the photoelectric conversion device 1. In this exemplary embodiment, the output electrode 5 is provided on a first surface of the sealing member 4 opposite to a second surface facing the organic EL device 3.

In this exemplary embodiment, since the photoelectric conversion element 3 is the organic EL device 3, the output electrode 5 provides a connection with wirings from an external power source for applying voltages to the anode 31 and the cathode 32.

When the photoelectric conversion element 3 is a solar cell element, the output electrode 5 provides a connection with wirings to an external device for discharging charges generated by the solar cell element.

As shown in FIGS. 1 and 2, the output electrode 5 is provided on the first surface of the sealing member 4 opposite to the second surface facing the organic EL device 3 as a pair of first and second output electrodes 51 and 52. The first output electrode 51 and the second output electrode 52 are respectively provided with protrusions 51a and 52a protruding outward beyond an end of the sealing member 4. In this exemplary embodiment, the first output electrode 51 and the second output electrode 52 are electrically connected respectively to the anode 31 and the cathode 32 via the side conductive portion 6, the electrical connecting member 8 and the substrate conductive member 9.

As shown in FIGS. 1 and 2, the position and the shape of the first output electrode 51 and the second output electrode 52 correspond to those of the connecting portions 21 and 22 of the substrate 2. The position and the shape of the first output electrode 51 and the second output electrode 52 are not limited to the above, but may be altered in accordance with the specification of the connection with an external power source so that the electrodes are not short-circuited.

The member for the output electrode 5 may be provided by an electrically conductive foil or film and the like. Preferably, the output electrode 5 is formed of a foil of a metal and an alloy such as a foil of Cu, Ag and Al.

Further, in this exemplary embodiment, the size of the sealing member 4 is smaller than that of the substrate 2 by a predetermined dimension so that the protrusions 51a and 52a are substantially coplanar with a side of the substrate 2 as shown in FIG. 2. With this arrangement, when a plurality of the photoelectric conversion devices 1 are to be adjacently disposed, the interference between the protrusions 51a and 52a of the adjoining photoelectric conversion devices 1 can be avoided.

Side Conductive Portion

The side conductive portion 6 is a portion disposed on a side face of the photoelectric conversion device to ensure an electrical connection between the output electrode 5 and the organic EL device 3. The side conductive portion 6 is provided outside an end of the sealing member 4 and is electrically connected with the output electrode 5. Further, the side conductive portion 6 includes side conductive portions 61 and 62 that are electrically connected to the respective protrusions 51a and 52a in an up-and-down direction.

In this exemplary embodiment, the side conductive portion 6 is integrated with the output electrode 5 so that the side conductive portion 6 covers an end surface of the sealing member 4. An end (lower end in FIG. 2) of the side conductive portion 6 extends to the substrate conductive member 9. Incidentally, the side conductive portions 61 and 62 are formed respectively corresponding to the first output electrode 51 and the second output electrode 52.

The side conductive portion 6 and the end surface of the sealing member 4 may be bonded by an adhesive or a fusion bonding or may not be bonded with each other.

Further, in this exemplary embodiment, the size of the sealing member 4 is smaller than that of the substrate 2 by a predetermined dimension so that the side conductive portions 61 and 62 are substantially coplanar with the side of the substrate 2 as shown in FIG. 2. With this arrangement, when a plurality of the photoelectric conversion devices 1 are to be adjacently disposed, the interference between the side conductive portions 6 of the adjoining photoelectric conversion devices 1 can be avoided.

Bonding Member

The bonding member 7 is one of the members for sealing the organic EL device 3. The bonding member 7 bonds the substrate 2 and the sealing member 4. As shown in FIG. 3, the bonding member 7 is provided around the organic compound layer 33 in a frame shape so that the organic compound layer can be hermetically sealed. Incidentally, as shown in FIG. 2, at the portion at which the substrate conductive member 9 is provided, the bonding member 7 bonds the substrate 2 with the sealing member 4 through the substrate conductive member 9.

The position (bonding position) for the bonding member 7 to be located is preferably near the end of the substrate 2 in order to enlarge the area in which the organic EL device 3 can be provided, though depending on the size of the substrate 2 and the space for providing the electrical connecting member 8. For instance, when the substrate 2 is a sheet glass member of 100 mm×100 mm×0.7 mm (height×width×thickness), it is especially preferable that the distance from the end of the substrate 2 to the bonding member 7 is in a range from 0.1 mm to 0.3 mm.

The width of the bonding member 7 (bonding width) is preferably narrow as long as a bonding strength between the substrate 2 and the sealing member 4 can be ensured in order to provide the photoelectric conversion device 1 in a narrow bezel structure. For instance, when the substrate 2 is a sheet glass member of 100 mm×100 mm×0.7 mm (height×width× thickness), it is especially preferable that the bonding width is in a range from 0.5 mm to 2 mm.

The bonding member 7 is preferably provided by an inorganic compound in terms of sealing performance, moisture resistance and bonding strength. A low-melting-point glass is preferable so as to make it possible to form the bonding member by a laser radiation. The "low-melting point" in this exemplary embodiment refers to a melting point of 650 degrees C. or less. The melting point is preferably in a range from 300 degrees C. to 600 degrees C. Further, the low-melting-point glass preferably contains transient metal oxide, rare-earth oxide and the like that can be bonded to glass, metal and the like, more preferably the low-melting-point glass contains a granulated glass (a fritted glass). The granulated glass preferably contains at least one of $SiO_2$, $B_2O_3$ and $Al_2O_3$.

Heat-Radiation Member

As described above, in the photoelectric conversion device 1, the top and bottom of the organic EL device 3 are covered by the substrate 2 and the sealing member 4, the circumference of the organic EL device 3 is surrounded by the bonding member 7 and the substrate 2 and the sealing member 4 are bonded by the bonding member 7 to seal the organic EL device 3.

At this time, the space surrounded by the substrate 2, the sealing member 4 and the bonding member 7 is defined as a sealed space S. The sealed space S is filled with a heat-radiation member 43 in addition to the organic EL device 3 provided therein.

The heat-radiation member 43 efficiently transmits the heat generated by the organic EL device 3 toward the sealing member 4.

The heat-radiation member 43 is preferably provided by an inactive member with excellent heat conductivity (e.g. fluorinated oil).

Electrical Connecting Member

The electrical connecting member 8 is one of the members for electrically connecting the side conductive portion 6 and the substrate conductive member 9 to establish an electrical connection from the output electrode 5 to the organic EL device 3.

As shown in FIGS. 2 and 3, the electrical connecting member 8 is provided to an outside (i.e. near an end of the substrate 2) relative to the bonding member 7. The electrical connecting member 81 is connected to the side conductive portion 61 and the substrate conductive member 91. The electrical connecting member 82 is connected to the side conductive portion 62 and the substrate conductive member 92.

As shown in FIG. 2, the electrical connecting member 8 (electrical connecting members 81, 82) is accommodated in a space between the bonding member 7 and the side conductive portions 61 and 62. Further, as shown in FIG. 2, the electrical connecting members 81 and 82 are respectively electrically connected with the substrate conductive members 91 and 92 in up-and-down direction and are electrically connected with an inside of the side conductive portions 61 and 62 in a direction along a surface of the substrate 2.

Further, as shown in FIG. 3, the electrical connecting members 81 and 82 have approximately the same width as the width of the substrate conductive members 91 and 92. Thus, since the electrical connecting members 81 and 82 are electrically conducted with the substrate conductive members 91 and 92 at wide regions, a stable electrical connection can be ensured.

The electrical connecting member 8 may be provided by an electrically conductive adhesive or a solder material. A low-melting-point solder material of which melting point is 300 degrees C. or less is preferably used.

Production Method of Photoelectric Conversion Device

Next, a production method of the photoelectric conversion device will be described below with reference to the attached drawings.

Production Step of Sealing Member Component

Figure 6A:
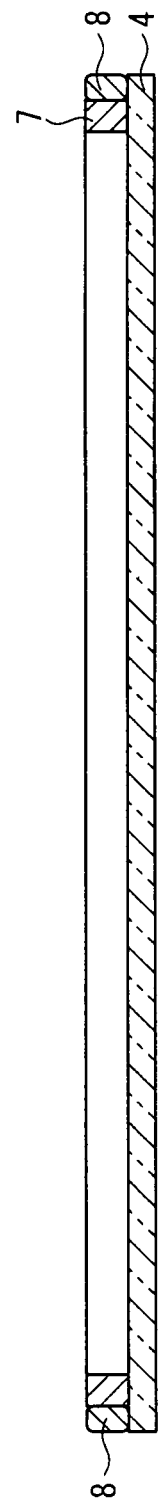
FIG. 6A schematically illustrates a production step of a component including a sealing member of the photoelectric conversion device according to the first exemplary embodiment.
Figure 6B:
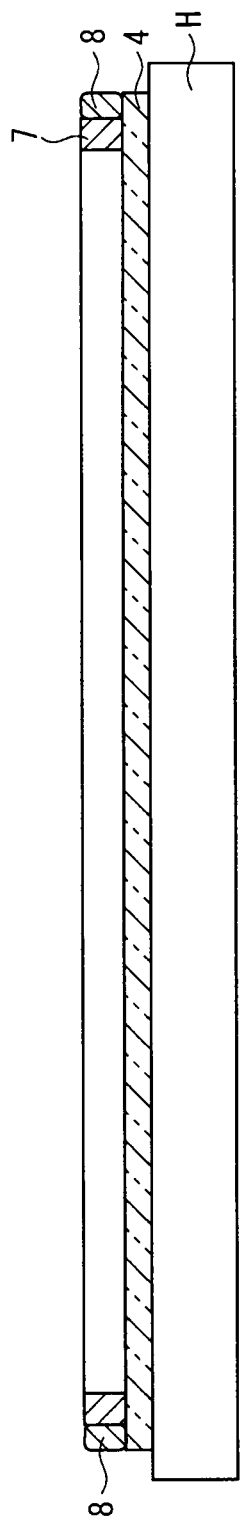
FIG. 6B schematically illustrates another production step of the component including the sealing member of the photoelectric conversion device according to the first exemplary embodiment.

FIGS. 6A to 6c schematically illustrate production steps of a component including the sealing member 4. Incidentally, FIGS. 6A to 6C illustrate cross sections of the sealing member 4 in thickness direction thereof, which illustrate an instance where the bonding member 7 and the like are applied on the sealing member 4.

Initially, as shown in FIG. 6A, the bonding member 7 is applied on one of the surfaces of the sealing member 4. Here, a fritted glass is used as the bonding member 7.

The bonding member 7 is applied on the sealing member 4 near the end thereof. Specifically, the bonding member 7 is applied on the sealing member 4 to surround the organic compound layer 33 in a frame shape with the space for providing the electrical connecting member 8 being retained as shown in FIG. 3, when the sealing member 4 is attached to the substrate 2. The bonding member 7 is applied in a width capable of ensuring the bonding strength.

The bonding member 7 is applied by, for instance, using a dispenser.

Next, the electrical connecting member 8 is applied at a position closer to the end of the sealing member 4 relative to the bonding member 7. Here, a low-melting-point solder material is used as the electrical connecting member 8. The electrical connecting member 8 is applied at the position corresponding to the portion to be electrically connected with the substrate conductive member 9. The electrical connecting member 8 is applied by, for instance, using a dispenser.

The bonding member 7 and the electrical connecting member 8 used herein are provided in a paste form when being applied and respectively contain alcohol component.

Subsequently, as shown in FIG. 6B, a heater H such as a hot plate is disposed on the other one of the surfaces opposite to the surface on which the bonding member 7 and the electrical connecting member 8 are applied, and the sealing member 4 is heated through the opposite surface to be subjected to a baking treatment. The alcohol component contained in the bonding member 7 and the electrical connecting member 8 is removed by the baking treatment. Incidentally, the heating may alternatively be conducted by putting the sealing member 4 in a heating furnace.

Then, as shown in FIG. 6C, the heat-radiation member 43 is applied on the surface of the sealing member 4 on which the bonding member 7 and the electrical connecting member 8 are applied. The heat-radiation member 43 is applied by, for instance, using a dispenser.

Production Step of Substrate Component

FIGS. 7A to 7D schematically illustrate production steps of a component including the substrate 2 of the photoelectric conversion device 1. Incidentally, FIGS. 7A to 7D illustrate cross sections of the substrate 2 in thickness direction thereof, which illustrate an instance where the organic EL device 3 is formed on the substrate 2.

In FIGS. 7A to 7D, alphabets and numerals are added for each of the portions of the substrate 2. The alphabets denote each of the production steps of the component including the substrate 2. In the numerals, "1" denotes a portion around the left connecting portion 21 in FIG. 2, "2" denotes a portion around the right connecting portion 22 in FIG. 2 and "3" denotes a periphery of the substrate 2 other than the connecting portions 21 and 22.

Initially, as shown in FIG. 7A, the auxiliary electrodes 34a, 34b and 34c (only the auxiliary electrode 34c is illustrated in FIG. 7A) and the substrate conductive members 91 and 92 are formed on the substrate 2. At this time, the substrate conductive members 91 and 92 are formed by a mask sputtering and the like so that the above-described holes 9A (see FIG. 4) are formed.

Figure 7B:
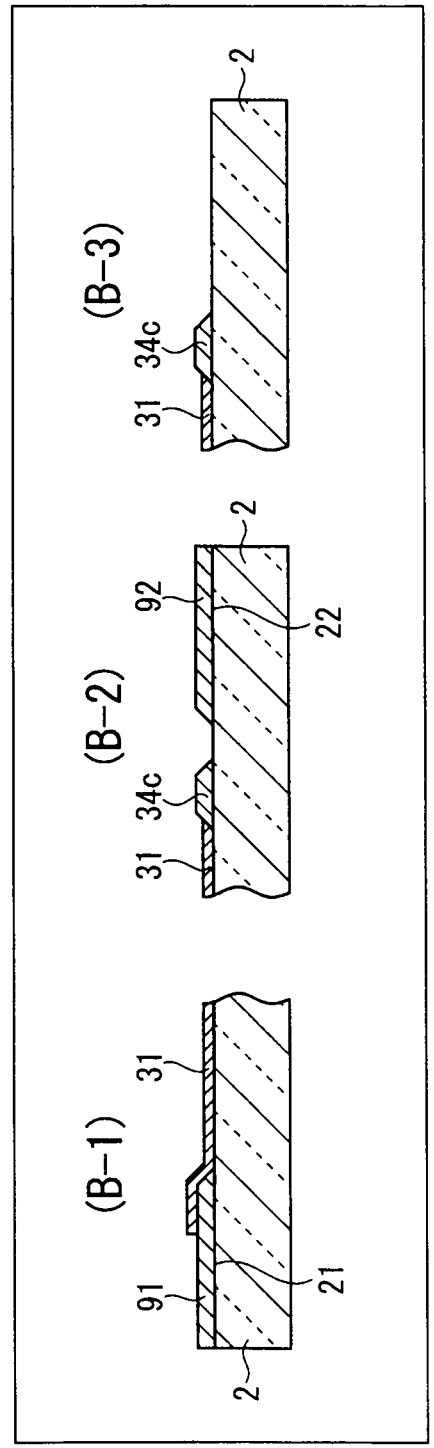
FIG. 7B schematically illustrates another production step of the component including the substrate of the photoelectric conversion device according to the first exemplary embodiment.

Subsequently, as shown in FIG. 7B, the anode 31 is formed on the substrate 2. The auxiliary electrode 34, the substrate conductive member 9 and the anode 31 can be formed by a known method such as vacuum deposition and sputtering. At this time, it is preferable that the auxiliary electrode 34, the substrate conductive member 9 and the anode 31 are formed at predetermined positions by a mask sputtering and the like.

At this time, two of the plurality of auxiliary electrodes 34 (34a and 34b: see FIG. 2) formed on the substrate 2 are covered by the anode 31. The anode 31 is in contact with a side face of the auxiliary electrode 34c. Further, the outer periphery of the anode 31 extends to the substrate conductive member 91 as shown in (B-1) of FIG. 7B and is formed at an area on the substrate 2 inside the auxiliary electrode 34c as shown in (B-2) and (B-3) of FIG. 7B.

Figure 7C:
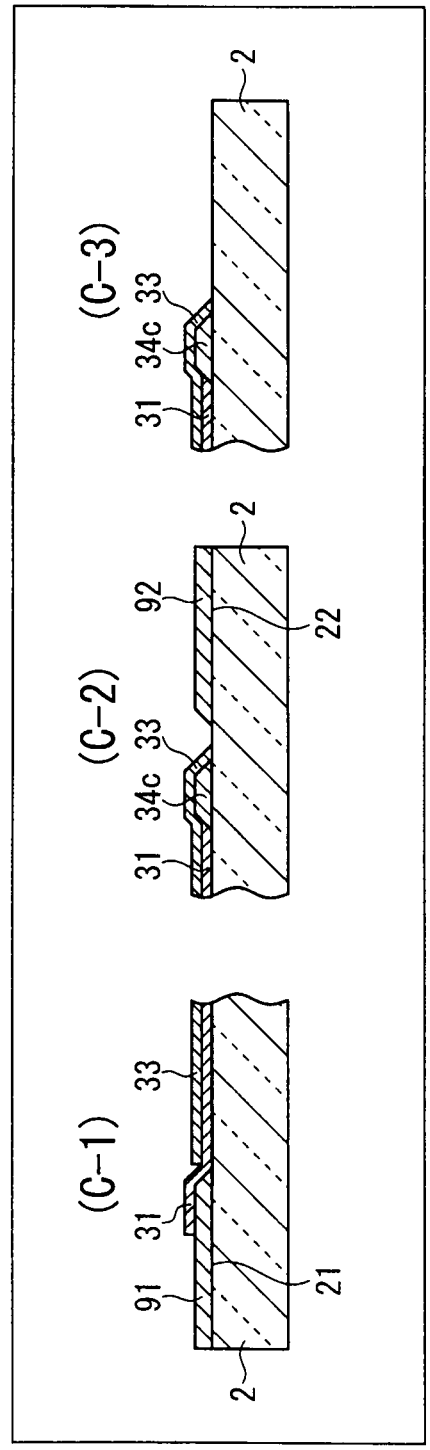
FIG. 7C schematically illustrates still another production step of the component including the substrate of the photoelectric conversion device according to the first exemplary embodiment.

Subsequently, as shown in FIG. 7C, the organic compound layer 33 is formed on the anode 31. The organic compound layer 33 may be formed by a known method including dry film-forming such as vacuum deposition, sputtering, plasma deposition and ion plating, and wet film-forming such as spin coating, dipping, flow coating and ink jet. At this time, it is preferable that a masking means is applied during layer formation so that the organic compound layer 33 is formed at predetermined positions.

As shown in (C-2) of FIG. 7C, an end of the organic compound layer 33 near the substrate conductive member 92 goes beyond the auxiliary electrode 34c to extend to a portion between the auxiliary electrode 34c and the substrate conductive member 92 where a surface of the substrate 2 is exposed. On the other hand, an end of the organic compound layer 33 near the substrate conductive member 91 is inwardly offset relative to an end of the anode 31 near the substrate conductive member 91 as shown in (C-1) of FIG. 7C.

Figure 7D:
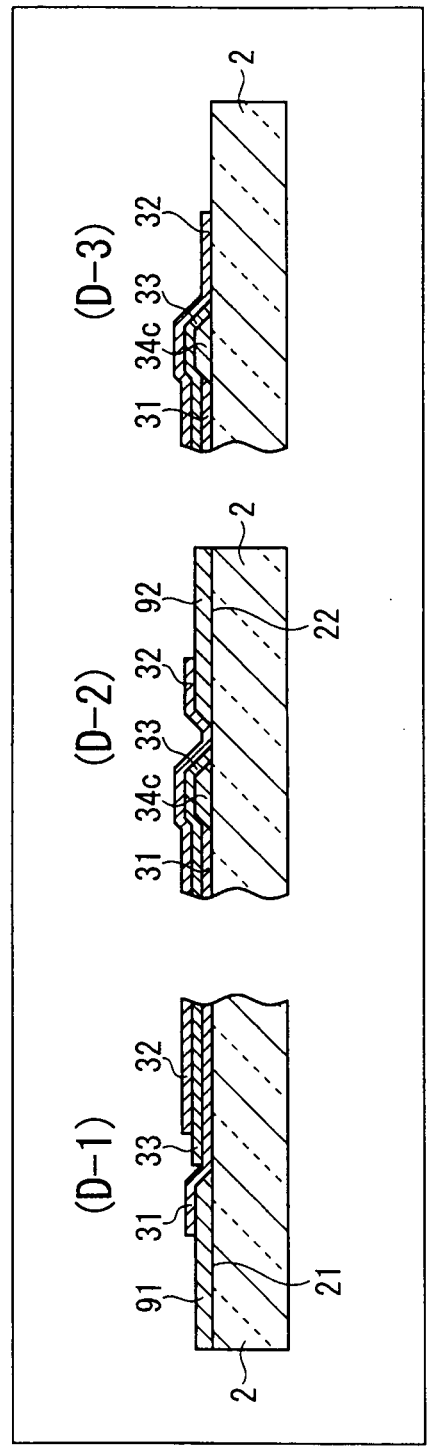
FIG. 7D schematically illustrates a further production step of the component including the substrate of the photoelectric conversion device according to the first exemplary embodiment.

Subsequently, as shown in FIG. 7D, the cathode 32 is formed on the organic compound layer 33. The cathode 32 may also be formed by a known method such as vacuum deposition and sputtering. At this time, it is preferable that the cathode 32 is formed at predetermined positions by a mask sputtering and the like.

As shown in (D-2) of FIG. 7D, an end of the cathode 32 near the substrate conductive member 92 goes beyond the auxiliary electrode 34c to extend onto the substrate conductive member 92. On the other hand, an end of the cathode 32 near the substrate conductive member 91 is inwardly offset relative to an end of the organic compound layer 33 near the substrate conductive member 91 in order to avoid a short circuit with the anode 31, as shown in (D-1) of FIG. 7D.

Adhesion Step

Figure 8A:
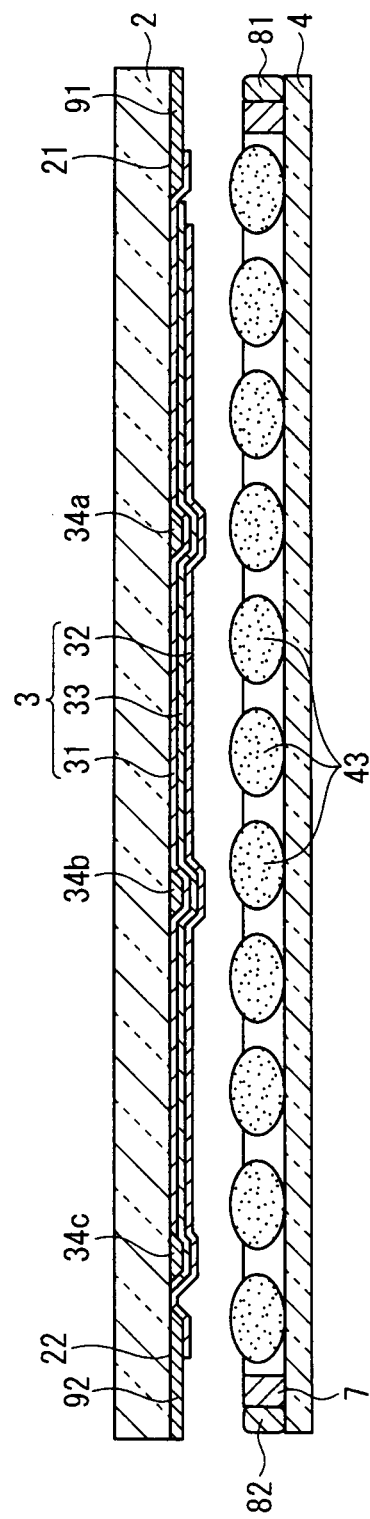
FIG. 8A schematically illustrates an adhesion step of the photoelectric conversion device according to the first exemplary embodiment.
Figure 8B:
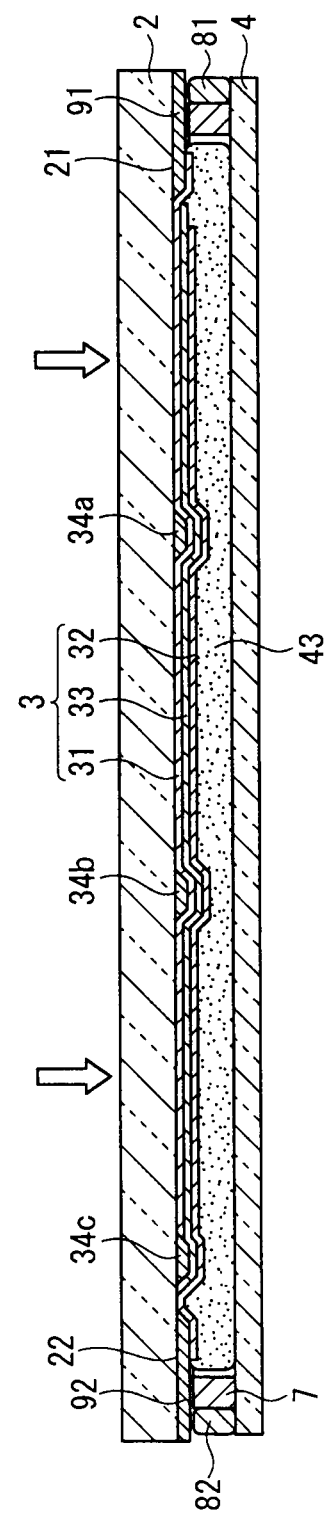
FIG. 8B schematically illustrates another adhesion step of the photoelectric conversion device according to the first exemplary embodiment.

FIGS. 8A to 8C schematically illustrate an adhesion step for adhering the component including the sealing member 4 and the component including the substrate 2 produced according to the above processes. FIGS. 8A to 8C illustrate cross sections of the substrate 2 and the sealing member 4 in a thickness direction, which illustrate an instance where the substrate 2 and the sealing member 4 are adhered in an up-and-down direction.

As shown in FIG. 8A, the surface (pointing upward) of the sealing member 4 on which the bonding member 7 and the electrical connecting member 8 are applied is adhered to the surface (pointing downward) of the substrate 2 on which the organic EL device 3 is formed in alignment with a predetermined bonding portion. During adhesion, a positioning jig and the like may be used for bonding at an accurate position.

Subsequently, as shown in FIG. 8B, the sealing member 4 is pressed in a direction of arrows to spread the heat-radiation member 43 applied on the sealing member 4 so that the sealed space S is filled with the heat-radiation member 43.

Next, as shown in FIG. 8C, the first output electrode 51 and the second output electrode 52 are formed on the sealing member 4 with the sealing member 4 pointing upward. In this exemplary embodiment, metal foil is prepared in advance by press molding and is rigidly attached to the sealing member 4 by an epoxy resin so that the protrusions 51a and 52a each protruding at an end of the sealing member 4 are formed and the side conductive portions 61 and 62 respectively extend from the protrusions 51a and 52a toward the substrate 2 when the metal foil is adhered to the sealing member 4. The side conductive portions 61 and 62 are brought into contact with the electrical connecting member 8.

Further, while keeping the contact state, laser is radiated in the direction of arrows as shown in FIG. 8C to locally heat the bonding portions to melt the bonding member 7 and the electrical connecting member 8, so that the heated bonding member 7 and the electrical connecting member 8 are bonded to members adjoined thereto. The laser output and laser movement speed is adjusted using a radiation thermometer so that the temperature of the bonding member 7 becomes 600 degrees C.

Thus, the sealing member 4 and the substrate 2 are adhered and the photoelectric conversion device 1 of a narrow bezel structure in which the organic EL device 3 is sealed is produced.

According to the above-described exemplary embodiment, the following advantages can be obtained.

(1) The bonding member 7 provided by a flitted glass surrounds an outside of the organic compound layer 33 of the organic EL device 3 in a frame shape and bonds the substrate 2 to the sealing member 4. Accordingly, even when the bonding width is narrow, the photoelectric conversion device 1 of a narrow bezel structure with excellent bonding strength and sealing performance can be obtained.

(2) The electrical connecting member 8 provided at an outer position relative to the bonding member 7 is electrically connected with an inside of the side conductive portion 6 and is electrically connected with the substrate conductive member 9 in the up-and-down direction, so that a stable electrical connection can be ensured.

Further, since the electrical connecting member 8 is provided inside the side conductive portion 6, a displacement of the electrical connecting member 8 before being laser-processed is restrained, thereby improving the yield rate of the photoelectric conversion device 1.

(3) The electrical connection is established from the organic EL device 3 to the output electrode 5 via the substrate conductive member 9, electrical connecting member 8 and the side conductive portion 6, where the output electrode 5 is situated in the thickness direction of the substrate 2. Accordingly, the space between the photoelectric conversion devices 1 can be reduced, so that joints between the devices are less likely to be recognizable.

(4) Since the electrical connecting member 8 is provided in the space between the bonding member 7 and the side conductive portion 6, the electrical connecting member 8 disposed near the end of the substrate 2 is well fitted in the photoelectric conversion device 1 and does not spread out of the side conductive portion 6. Thus, even when a plurality of the photoelectric conversion devices 1 are adjacently disposed, the interference between the electrical connecting members 8 spread out of the substrate 2 can be avoided, so that the photoelectric conversion devices 1 can be disposed with small gaps and the joints between the photoelectric conversion devices 1 are less likely to be recognizable.

(5) Since the first output electrode 51 and the side conductive portion 61, and the second output electrode 52 and the side conductive portion 62 are provided by unified members, the number of components necessary for extracting electricity from the organic EL device 3 can be reduced, thereby simplifying the structure and production process of the photoelectric conversion device 1.

(6) Since the auxiliary electrode 34 and the substrate conductive member 9 are provided on the substrate 2, a voltage reduction on account of electric resistance of the transparent electrode material used for the anode 31 can be avoided, so that a stable electric connection of the anode 31 and the cathode 32 with the output electrode 5 can be ensured.

(7) Since the side conductive portions 61 and 62 are electrically connected with the protrusions 51a and 52a of the output electrodes 51 and 52 in the up-and-down direction, it is not necessary to extend the side conductive portions 61 and 62 to an upper side of the output electrodes 51 and 52 for connection, so that a stable electrical connection can be established with a simple connection structure.

Next, a second exemplary embodiment of the invention will be described below with reference to the attached drawings.

In the description of the second exemplary embodiment, the same components as those in the first exemplary embodiment are denoted by the same reference signs to simplify or omit an explanation of the components.

Figure 9:
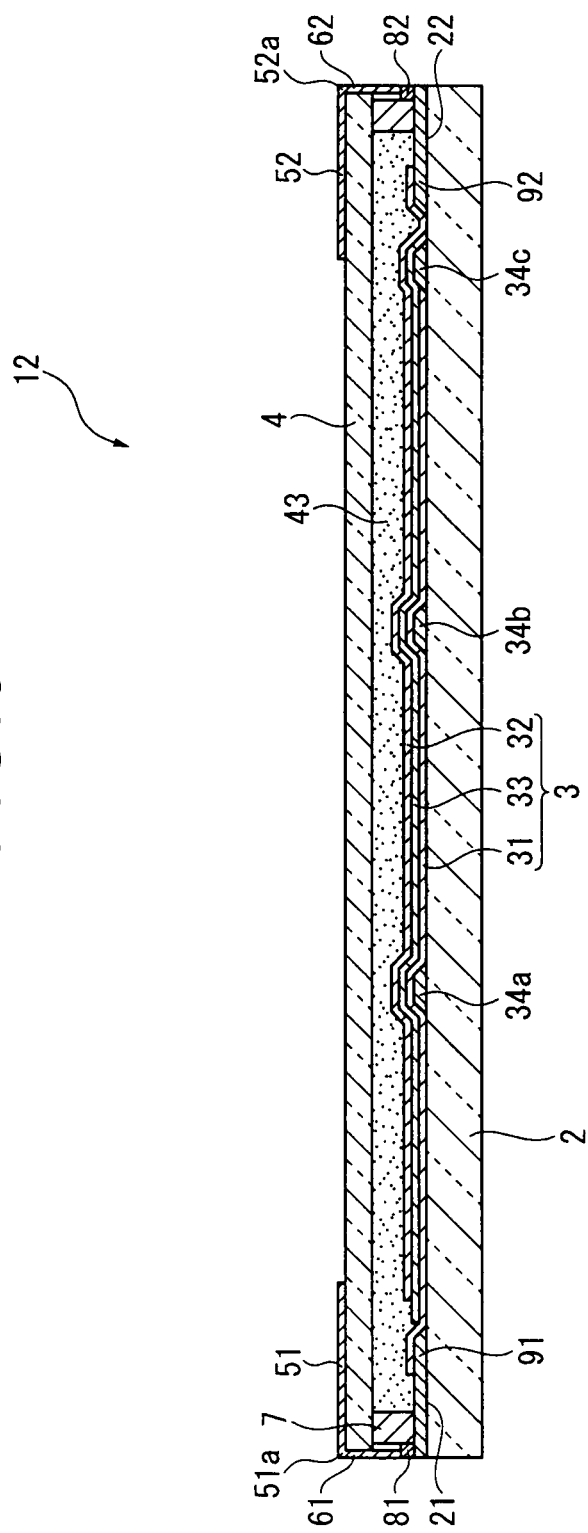
FIG. 9 is a cross section in a substrate-thickness direction showing a photoelectric conversion device according to a second exemplary embodiment of the invention.

FIG. 9 is a cross section in a thickness direction of a photoelectric conversion device 12 according to the second exemplary embodiment.

The photoelectric conversion device 12 according to the second exemplary embodiment is different from the photoelectric conversion device 1 of the first exemplary embodiment in the bonding method between the side conductive portion 6 and the electrical connecting member 8. Specifically, the side conductive portions 61 and 62 respectively protrude to positions facing the substrate conductive members 91 and 92 near the ends of the substrate 2. The electrical connecting members 81 and 82 are provided between the ends (lower end in FIG. 9) of the side conductive portions 61 and 62 and the substrate conductive members 91 and 92. In other words, unlike the first exemplary embodiment, the electrical connecting member 8 is not provided in the space defined by the outside of the bonding member 7 and the inside of the side conductive portion 6, so that the bonding member 7 and the side conductive portion 6 are electrically connected in the up-and-down direction as shown in FIG. 9. Thus, the bonding position of the bonding member 7 is located nearer to the end of the substrate 2 than that in the first exemplary embodiment.

According to the second exemplary embodiment, the following advantage as well as advantages (1) to (3) and (5) to (7) in the first exemplary embodiment can be obtained.

(8) The space defined by the outside of the bonding member 7 and the inside of the side conductive portion 6 for providing the electrical connecting member 8 can be reduced, so that the bonding member 7 can be provided further outside (i.e. near the end of the substrate 2). Accordingly, the space on the substrate 2 for providing the organic EL device 3 can be further enlarged while ensuring the reliability of the conduction between the side conductive portion 6 and the substrate conductive member 9, so that the luminous area can be enlarged.

Next, a third exemplary embodiment of the invention will be described below with reference to the attached drawings.

In the description of the third exemplary embodiment, the same components as those in the above exemplary embodiments are denoted by the same reference signs to simplify or omit an explanation of the components.

Figure 10:
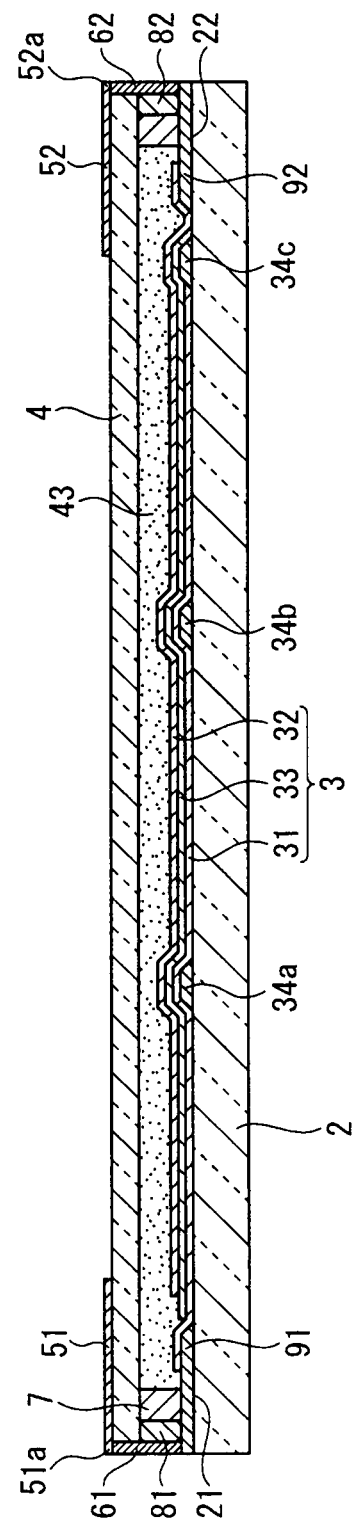
FIG. 10 is a cross section in a substrate-thickness direction showing a photoelectric conversion device according to a third exemplary embodiment of the invention.

FIG. 10 is a cross section in a thickness direction of a photoelectric conversion device 13 according to the third exemplary embodiment.

The photoelectric conversion device 13 according to the third exemplary embodiment is different from the photoelectric conversion device 1 of the first exemplary embodiment in the structure of the output electrode 5 and the side conductive portion 6. Specifically, the output electrode 5 and the side conductive portion 6 are provided by independent bodies.

The ends of the first output electrode 51 and the second output electrode 52 protrude outward beyond an end of the sealing member 4. The side conductive portions 61 and 62 are provided by members independent of the respective protruded portions. The side conductive portions 61 and 62 are provided on an outside of the end of the sealing member 4 to cover the end surface of the sealing member 4.

In the third exemplary embodiment, the materials usable for the output electrode 5 and the side conductive portion 6 may be the same as those described in the first exemplary embodiment. The output electrode 5 and the side conductive portion 6 may be provided by the same material or may be provided by different materials.

The output electrode 5 and the side conductive portion 6 may be exemplarily connected by soldering, bonding and welding.

According to the third exemplary embodiment, the following advantages as well as advantages (1) to (4) and (6) to (7) in the first exemplary embodiment can be obtained.

(9) Since it is not necessary to bend the member for the output electrode 5 at the end of the sealing member 4 to form the side conductive portion 6, electrical connection can be securely established even when the output electrode 5 is provided by a member that is not easily bent.

(10) When the sealing member 4 is thin, it is difficult to form the side conductive portions 61 and 62 by bending the member for the first output electrode 51 and the second output electrode 52 at the end of the sealing member 4. Accordingly, the side conductive portions 61 and 62 provided by independent bodies facilitate the production of a photoelectric conversion device with a thin sealing member.

Next, a fourth exemplary embodiment of the invention will be described below with reference to the attached drawings.

In the description of the fourth exemplary embodiment, the same components as those in the above exemplary embodiments are denoted by the same reference signs to simplify or omit an explanation of the components.

Figure 11:
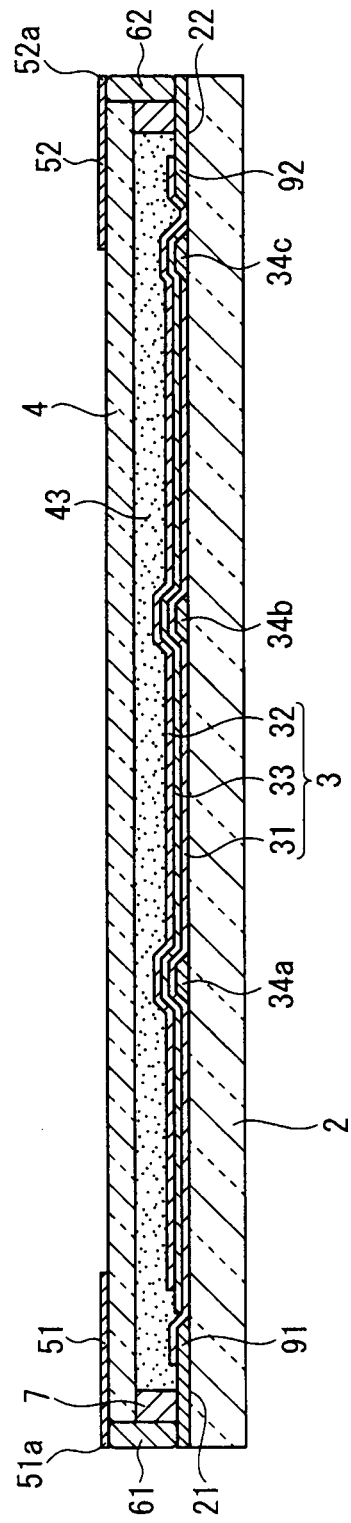
FIG. 11 is a cross section in a substrate-thickness direction showing a photoelectric conversion device according to a fourth exemplary embodiment of the invention.

FIG. 11 is a cross section in a thickness direction of a photoelectric conversion device 14 according to the fourth exemplary embodiment.

The photoelectric conversion device 14 according to the fourth exemplary embodiment is different from the photoelectric conversion device 13 of the third exemplary embodiment in the electrical connection structure by the electrical connecting member 8.

The side conductive portions 61 and 62 are respectively electrically connected with the protrusions 51a and 52a of the output electrodes 51 and 52 and are electrically connected with the substrate conductive members 91 and 92 in the up-and-down direction. In the above, the side conductive portions 61 and 62 may be provided by the same material as that of the electrical connecting member 8.

According to the fourth exemplary embodiment, the following advantages as well as advantages (1) to (7) and (9) to (10) in the first and third exemplary embodiments can be obtained. (11) Since the output electrodes 51 and 52 and the substrate conductive members 91 and 92 are electrically connected by the side conductive portions 61 and 62 in the up-and-down direction, it is not necessary to provide an independent electrical connecting member or to bend the member for the first output electrode 51 and the second output electrode 52, so that the structure and the production process of the photoelectric conversion device 1 can be simplified.

(12) Since the side conductive portions 61 and 62 are provided outside the end of the substrate 2 and a side of the sealing member 4, the bonding member 7 can be provided further outside (i.e. near the end of the substrate 2) as compared to that in the first and third exemplary embodiments. Accordingly, the space on the substrate 2 for providing the organic EL device 3 can be further enlarged, so that the luminous area can be enlarged. Incidentally, when the sealing member 4 is thin, it is difficult to form the side conductive portions 61 and 62 by bending the member for the first output electrode 51 and the second output electrode 52 at the end of the sealing member 4. Accordingly, the present arrangement in which the side conductive portions 61 and 62 provided independently of the first and the second output electrodes 51 and 52 are directly connected to the output electrode is necessarily effective.

When a low-melting-point metal is used for the side conductive portions 61 and 62 in this exemplary embodiment, the low-melting-point metal can be disposed as the side conductive portions 61 and 62 when the thickness of the sealing member 4 is, for instance, approximately 1 mm, so that electrical conduction can be ensured.

Next, a fifth exemplary embodiment of the invention will be described below with reference to the attached drawings.

In the description of the fifth exemplary embodiment, the same components as those in the above exemplary embodiments are denoted by the same reference signs to simplify or omit an explanation of the components.

Figure 12:
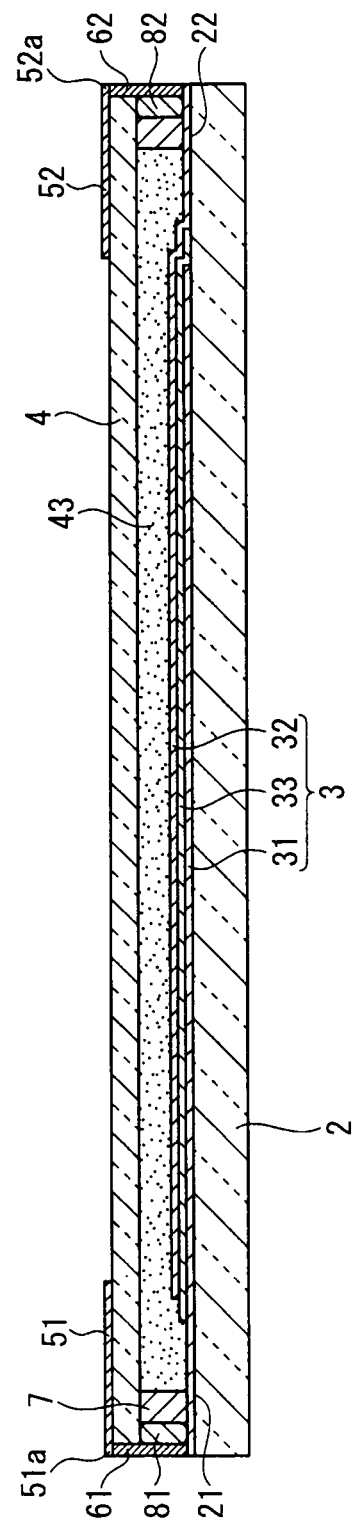
FIG. 12 is a cross section in a substrate-thickness direction showing a photoelectric conversion device according to a fifth exemplary embodiment of the invention.

FIG. 12 is a cross section in a thickness direction of a photoelectric conversion device 15 according to the fifth exemplary embodiment.

The photoelectric conversion device 15 according to the fifth exemplary embodiment is different from the photoelectric conversion device 13 of the third exemplary embodiment in that the anode 31 and the cathode 32 of the organic EL device 3 are extended to the end of the substrate 2.

According to the fifth exemplary embodiment, the following advantage as well as advantages (1) to (7) and (9) to (10) in the first and third exemplary embodiments can be obtained. (13) Since the anode 31 and the cathode 32 are extended to the end of the substrate 2, it is not necessary to separately provide the substrate conductive member 9 on the substrate 2, so that the structure and production process of the photoelectric conversion device 1 can be simplified.

Next, a sixth exemplary embodiment of the invention will be described below with reference to the attached drawings.

In the description of the sixth exemplary embodiment, the same components as those in the above exemplary embodiments are denoted by the same reference signs to simplify or omit an explanation of the components.

Figure 13:
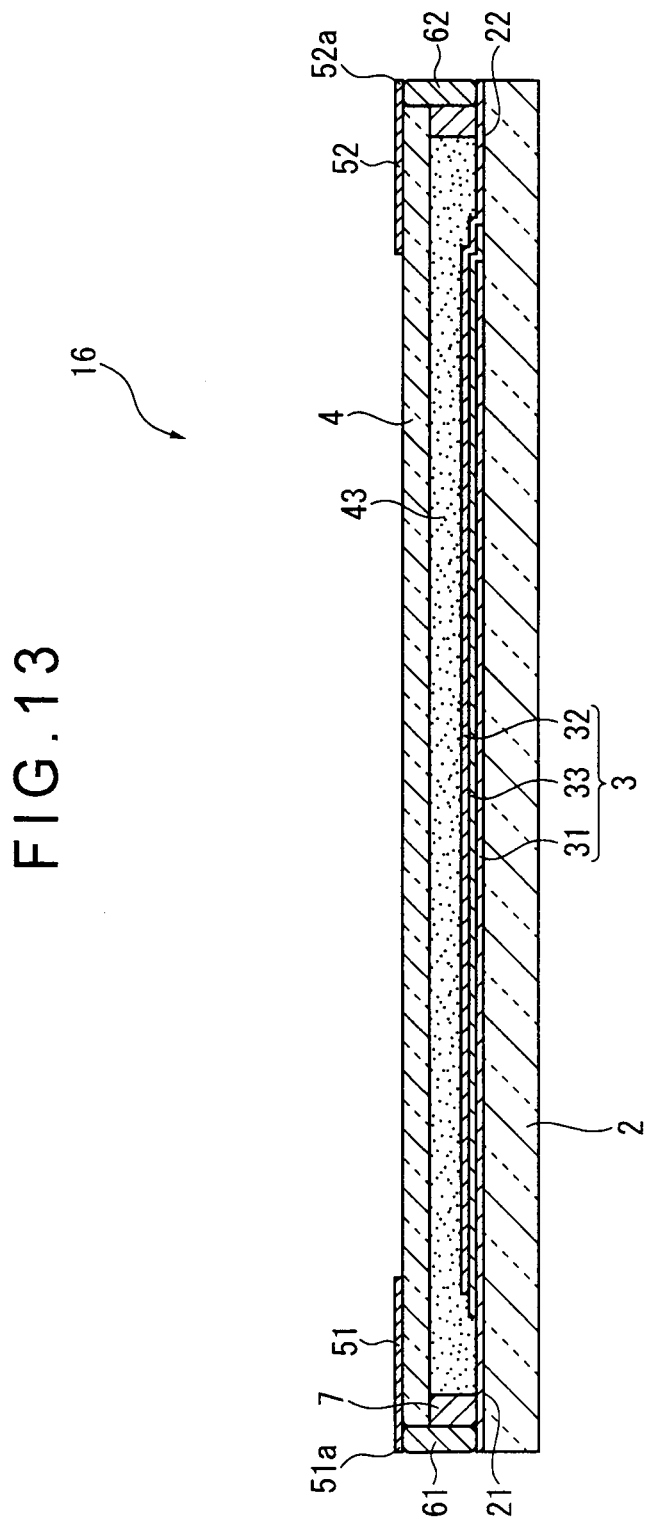
FIG. 13 is a cross section in a substrate-thickness direction showing a photoelectric conversion device according to a sixth exemplary embodiment of the invention.

FIG. 13 is a cross section in a thickness direction of a photoelectric conversion device 16 according to the sixth exemplary embodiment.

The photoelectric conversion device 16 according to the sixth exemplary embodiment is different from the photoelectric conversion device 14 of the fourth exemplary embodiment in that the anode 31 and the cathode 32 of the organic EL device 3 are extended to the end of the substrate 2.

According to the sixth exemplary embodiment, the advantages (1) to (7) and (9) to (13) in the first, third and fourth exemplary embodiments can be obtained.

Next, a seventh exemplary embodiment of the invention will be described below with reference to the attached drawings.

In the description of the seventh exemplary embodiment, the same components as those in the above exemplary embodiments are denoted by the same reference signs to simplify or omit an explanation of the components.

Figure 14:
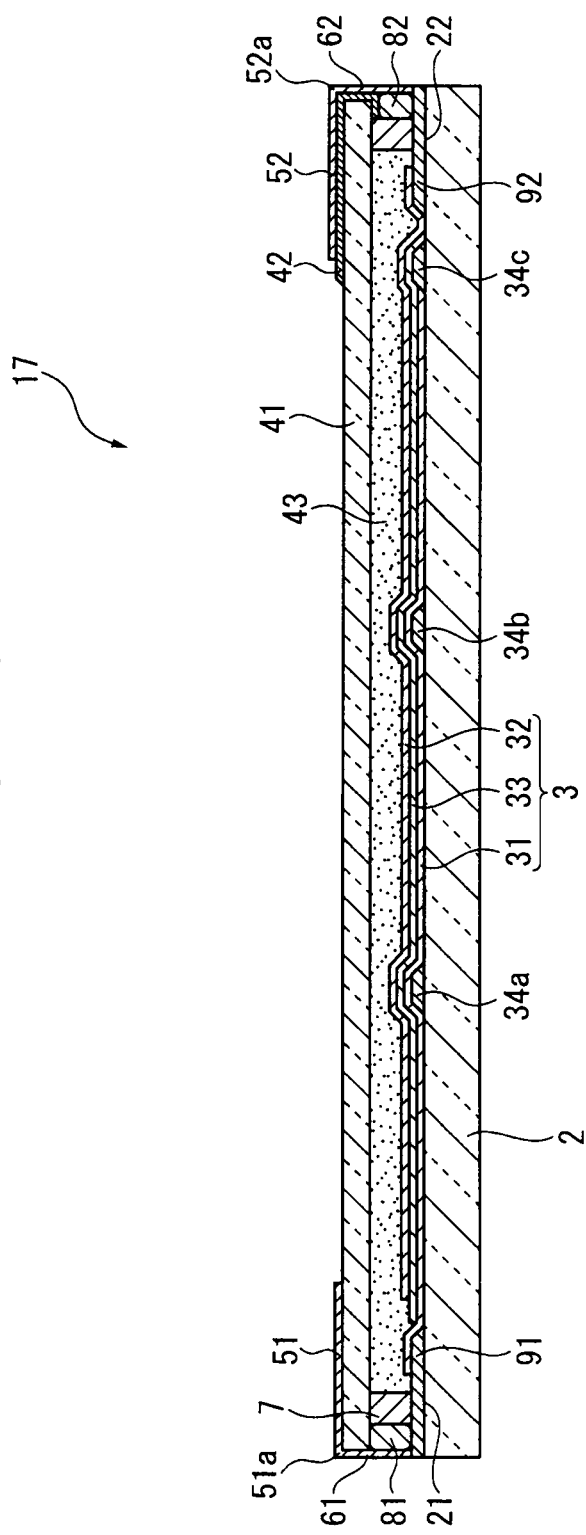
FIG. 14 is a cross section in substrate-thickness direction showing a photoelectric conversion device according to a seventh exemplary embodiment of the invention.

FIG. 14 is a cross section in a thickness direction of a photoelectric conversion device 17 according to the seventh exemplary embodiment.

The photoelectric conversion device 17 according to the seventh exemplary embodiment is different from the photoelectric conversion device 1 of the first exemplary embodiment in that the sealing member 4 is provided by a conductive sealing member 41. At a portion where the second output electrode 52, the side conductive portion 62 and the electrical connecting member 82 are close to the conductive sealing member 41, an external insulation layer 42 (insulative portion) is provided in order to avoid short-circuiting caused on account of mutual contact. As shown in FIG. 14, the external insulation layer 42 extends from an upper side of the conductive sealing member 41 through a side face to a lower side. The anode 31 of the organic EL device 3 is electrically connected with the first output electrode 51 via the substrate conductive member 91, the electrical connecting member 81 and the side conductive portion 61. The first output electrode 51 is connected with the conductive sealing member 41. It is only necessary for the first output electrode 51 and the conductive sealing member 41 to be connected in a condition in which conduction is secured.

Any conductive member may be used for the conductive sealing member 41. For instance, a metal plate or a metal foil may be used. Further, the sealing member 4 itself may not be electrically conductive if the surface of the sealing member 4 is coated with an electrically conductive material.

It is only necessary for the external insulation layer 42 to be formed of an electrically insulative material. The external insulation layer 42 may be formed by a mask evaporation, mask sputtering and the like using silicon oxide ($SiO_2$), aluminum oxide and the like. Alternatively, the external insulation layer 42 may be formed by attaching an insulative film or foil to the conductive sealing member 41.

According to the seventh exemplary embodiment, the following advantage as well as advantages (1) to (7) in the first exemplary embodiment can be obtained.

(14) The sealing member 4 of the photoelectric conversion device 17 is provided by the conductive sealing member 41 and the anode 31 of the organic EL device 3 is electrically connected with the first output electrode 51 via the electrical connecting member 8 and the like, and further with the conductive sealing member 41. Thus, the wiring from an external power source of the anode 31 can be connected not only to the first output electrode 51 but also to the conductive sealing member 41, so that the electrical connecting position can be more freely determined.

Next, an eighth exemplary embodiment of the invention will be described below with reference to the attached drawings.

In the description of the eighth exemplary embodiment, the same components as those in the above exemplary embodiments are denoted by the same reference signs to simplify or omit an explanation of the components.

Figure 15:
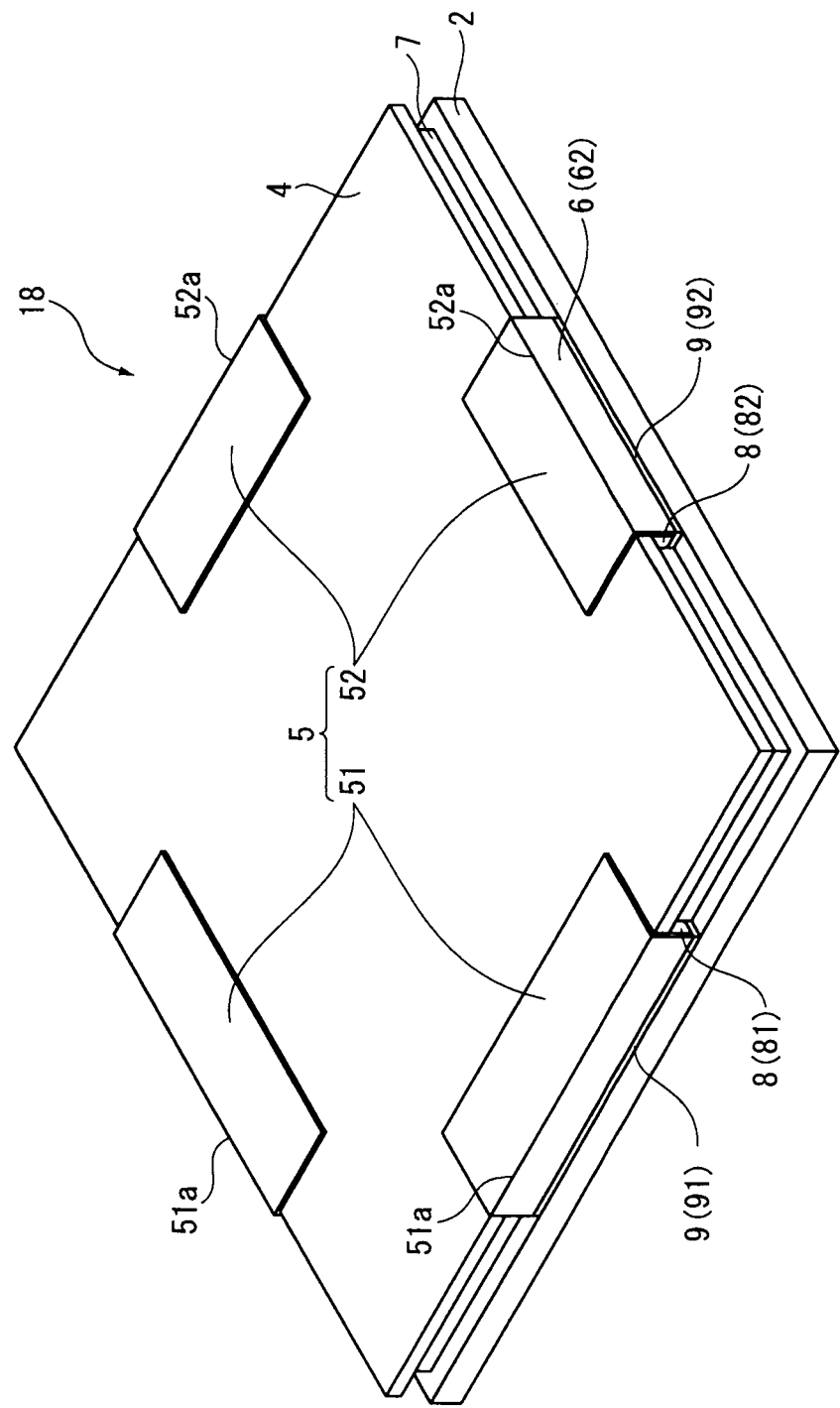
FIG. 15 is a perspective view showing a photoelectric conversion device according to an eighth exemplary embodiment of the invention.

FIG. 15 is a perspective view showing a photoelectric conversion device 18 provided with a plurality of the first output electrodes 51 and the second output electrodes 52.

The photoelectric conversion device 18 according to the eighth exemplary embodiment is different from the photoelectric conversion device 1 of the first exemplary embodiment in that the first output electrode 51 is provided in a pair and the second output electrode 52 is provided in a pair.

As exemplified in the eighth exemplary embodiment, the invention encompasses an arrangement in which at least one of the first output electrode 51 and the second output electrode 52 is provided in plural unlike the above exemplary embodiments in which one first output electrode 51 and one second output electrode 52 are provided.

Since the output electrode 5 reduces the sheet resistance of the first electrode or the second electrode, the plurality of output electrodes 5 favorably further reduce the sheet resistance. It is preferable that the number or the area of one of the output electrodes electrically connected with one of the first electrode and the second electrode that employs a transparent electrode with a higher sheet resistance (e.g. ITO) is made larger than that of the other one of the output electrodes.

In the photoelectric conversion device 18, the anode (first electrode) is a transparent electrode provided by ITO and the cathode (second electrode) is an electrode provided by aluminum. Since ITO exhibits a higher resistance than that of aluminum, the area of the first output electrode 51 connected to the anode is made larger than that of the second output electrode 52 in order to reduce the sheet resistance of the anode (see FIG. 15). Further, in order to restrain a voltage drop by ITO with a high sheet resistance for avoiding uneven luminance, it is effective that the number of the first output electrode 51 is more than the number of the second output electrode 52.

Next, a ninth exemplary embodiment of the invention will be described below with reference to the attached drawings.

In the description of the ninth exemplary embodiment, the same components as those in the above exemplary embodiments are denoted by the same reference signs to simplify or omit an explanation of the components.

Figure 16:
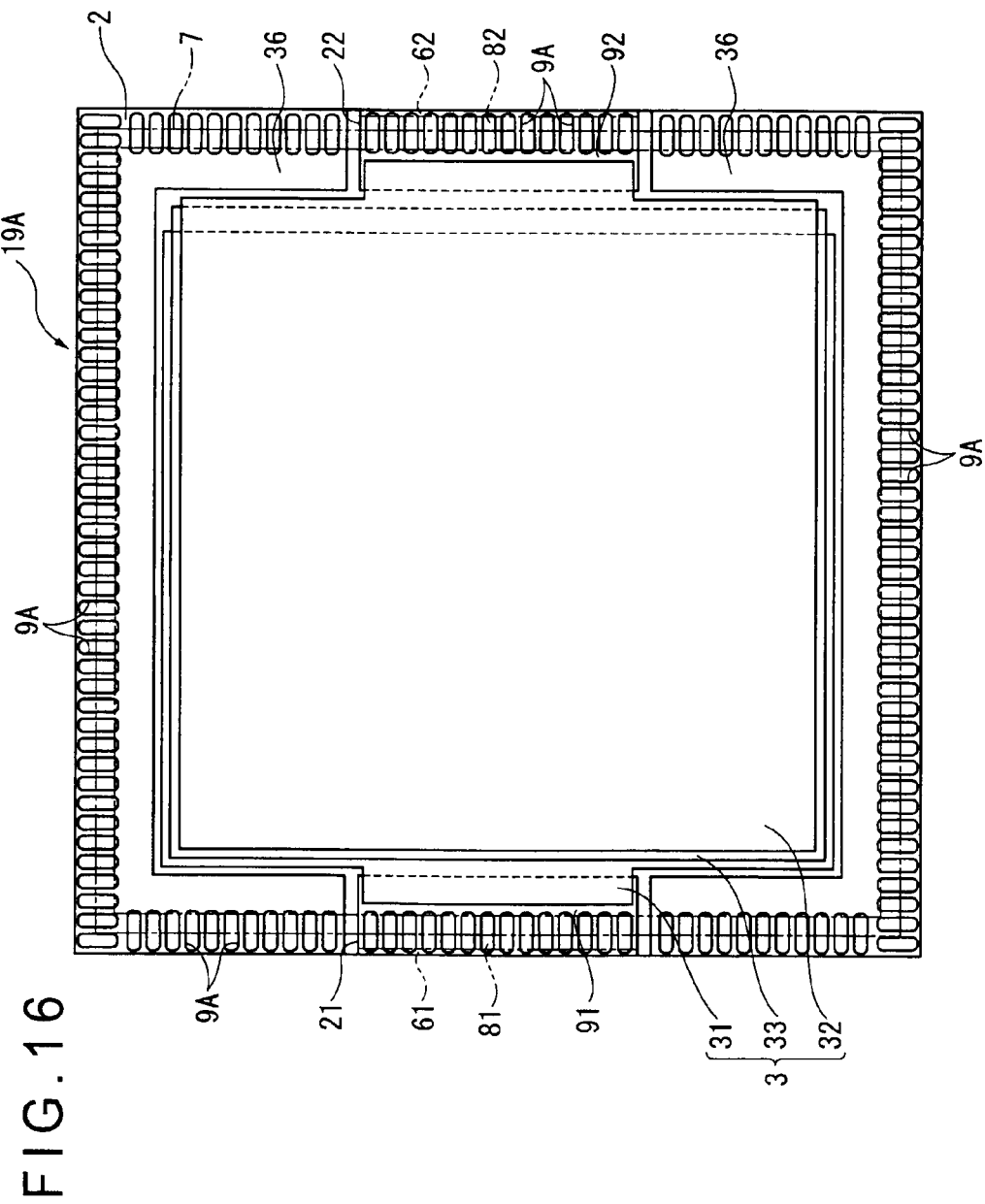
FIG. 16 is a plan view of a cross section showing a photoelectric conversion device according to a ninth exemplary embodiment of the invention.

FIG. 16 is a plan view (seen facing the substrate 2) of a cross section of a photoelectric conversion device 19A taken along the surface of the substrate 2. FIG. 17 is a plan view (seen facing the substrate 2) of a cross section of a photoelectric conversion device 19B taken along the surface of the substrate 2.

The photoelectric conversion devices 19A and 19B according to the ninth exemplary embodiment are different from the photoelectric conversion device 1 of the first exemplary embodiment in that a light-reflecting portion 36 is provided on the substrate 2. Incidentally, the cross sections in FIGS. 16 and 17 are taken at approximately the same position as that in FIG. 3 according to the first exemplary embodiment. In FIGS. 16 and 17, for the convenience of description, the side conductive portions 61 and 62, the bonding member 7 and the electrical connecting members 81 and 82 are represented in two-dot chain lines.

The light-reflecting portion 36 is a layer provided by a light-reflecting material to reflect the light generated in the organic compound layer 33 in the light-extraction direction. The light-reflecting portion 36 is exemplarily provided by forming a metal film by evaporation and the like or by adhering a metal foil or a metal plate. Further, when the substrate conductive member 9 is provided by a metal such as Al, Cu and Ag, it is preferable that the light-reflecting portion 36 is provided by the same material as that of the substrate conductive member 9. With the same material, the substrate conductive member 9 and the light-reflecting portion 36 can be simultaneously formed.

The light-reflecting portion 36 is provided on the substrate 2 at a region different from the region at which the substrate conductive member 9, the auxiliary electrode 34 and the organic EL device 3 are formed. The light-reflecting portion 36 is preferably provided throughout the region different from the region at which the substrate conductive member 9, the auxiliary electrode 34 and the organic EL device 3 are formed. Accordingly, at least one of the substrate conductive member 91, the substrate conductive member 92 and the auxiliary electrode may be integrated with the light-reflecting portion 36 so that the area of the light-reflecting portion 36 is made as large as possible.

The anode 31 and the cathode 32 of the organic EL device 3 may be short-circuited when the light-reflecting portion 36 provided by a conductive material is in contact with both of the substrate conductive member 91 and the substrate conductive member 92 on the substrate 2. Accordingly, it is preferable to prevent short-circuiting by providing a predetermined gap between the light-reflecting portion 36 and one of the substrate conductive member 91 and the substrate conductive member 92 or by interposing an insulative material therebetween.

The light-reflecting portion 36 is preferably formed on the substrate 2, for instance, as illustrated in FIGS. 16 and 17. In the plan view of the substrate 2, the light-reflecting portion 36 is provided throughout the substrate 2 at a region spaced with a predetermined distance apart from the substrate conductive member 9, the auxiliary electrode 34 and the organic EL device 3 on the substrate 2 so as to avoid a contact therebetween.

As shown in FIG. 16, a plurality of holes 9A are formed in the substrate conductive member 9 and the light-reflecting portion 36 of the photoelectric conversion device 19A along the ends of the substrate 2. In other words, the holes 9A of the substrate conductive member 9 described in the first exemplary embodiment are also formed in the light-reflecting portion 36.

The substrate conductive member 9 and the light-reflecting portion 36 of the photoelectric conversion device 19A are simultaneously formed. For instance, the substrate conductive member 9 and the light-reflecting portion 36 are formed of the same metal material (e.g. Al) by sputtering and the like. Subsequently, the holes 9A are formed by a pattern etching. The holes 9A herein are provided in an approximately ellipsoidal shape.

As shown in FIG. 17, a plurality of holes 9B having a shape different from that of the plurality of holes 9A are formed in the substrate conductive member 9 and the light-reflecting portion 36 of the photoelectric conversion device 19B along the ends of the substrate 2.

The substrate conductive member 9 and the light-reflecting portion 36 of the photoelectric conversion device 19B are also simultaneously formed as in the photoelectric conversion device 19A. However, the substrate conductive member 9 and the light-reflecting portion 36 of the photoelectric conversion device 19B are formed with the holes 9B being formed in advance by mask sputtering and the like. The holes 9B herein are provided in an approximately rectangular shape that is elongated inward from the end of the substrate 2.

The holes 9B are provided for smoothly conducting the bonding by laser radiation in the same manner as the holes 9A.

According to the ninth exemplary embodiment, the following advantages as well as advantages (1) to (7) in the first exemplary embodiment can be obtained.

(15) The light emitted from the organic compound layer 33 of the organic EL device 3 is directly emitted from the substrate 2 in the light-extraction direction without propagating in the substrate 2 or is emitted from the substrate 2 in the light-extraction direction or in an opposite direction after propagating in the substrate 2. Since the light-reflecting portion 36 of the photoelectric conversion devices 19A and 19B is provided on the substrate 2 at a region different from the region on which the substrate conductive member 9 and the like are formed, the emission light propagating in the substrate 2 to the region at which the light-reflecting portion 36 is provided is not reflected in the direction opposite to the light-extraction direction but is emitted in the light-extraction direction. Thus reflected light is emitted in the light-extraction direction or is further reflected to propagate toward the end of the substrate 2 to be emitted in the light-extraction direction.

As described above, since the light-reflecting portion 36 is formed on the substrate 2, the light emitted from the organic EL device 3 propagates to a bonding portion provided near the end of the substrate 2 at which the organic EL device 3 is not formed and is emitted in the light-extraction direction. Thus, since the bonding portion is hid by the light, the joints between the photoelectric conversion devices 19A or 19B and the bonding portion are less likely to be recognizable when a plurality of the photoelectric conversion devices 19A or 19B are adjacently provided.

(16) Further, since the bonding portion can be hid by light, the bonding width of the bonding portion can be enlarged to improve the bonding strength, so that the photoelectric conversion device can be more freely designed.

Solar Cell Element as Photoelectric Conversion Element

Next, a tenth exemplary embodiment of the invention will be described below.

The photoelectric conversion element 3 used for the photoelectric conversion device 1 is exemplified by the organic EL device 3 in the above exemplary embodiments. However, the invention is applicable not only to the organic EL device 3 but also to any devices such as an organic thin-film solar cell element and a dye-sensitised solar cell that are required to be airproof.

The organic thin-film solar cell element may be provided by sequentially layering a transparent conductive film, a P-type organic semiconductor, an N-type organic semiconductor and a conductive film on the substrate 2 (light incident face). The transparent conductive film may be provided by a transparent electrode material so that the light through the substrate 2 reaches a solar cell layer (the P-type organic semiconductor and the N-type organic semiconductor). Examples of the transparent electrode material include ITO (indium tin oxide), ZnO (zinc oxide) and $SnO_2$ (tin oxide).

The conductive film may be provided as a less light-absorptive and highly reflective metal electrode such as aluminum, gold, silver and titanium that is suitable as a reflective film. Alternatively, a multilayered electrode of the above metals, or a multilayered electrode with layers of the above metals, other metals, conductive oxides (e.g. the above materials for the transparent electrode) and conductive organic compounds may be used as the reflective film. The rest of the components may be the same as those in the exemplary embodiments.

It should be noted that the invention is not limited to the above exemplary embodiments but may include the following modifications as long as such modifications are compatible with an object of the invention.

Though the sealed space S is filled with the heat-radiation member 43 in the above exemplary embodiments, the sealed space S may not be filled with the heat-radiation member 43. For instance, the sealed space S may be vacuumized or may be filled with dry gas.

Further, in the above seventh exemplary embodiment, the external insulation layer 42 may be provided at the portion where the first output electrode 51 and the side conductive portion 61 are in contact with the conductive sealing member 41.

It is only necessary that at least one of the first and second electrodes is connected by the above-described electrical connecting structure according to the invention. Further, when the plurality of output electrodes 5 are formed as described in the eighth exemplary embodiment, it is only necessary that at least one of the plurality of electrodes is connected by the electric connecting structure according to the invention.

In addition, the number, position and area of the output electrode 5 may be arranged in a manner different from that described in the above exemplary embodiments. For instance, the first output electrode 51 and the second output electrode 52 may not be provided at the opposing two sides but may be provided at each of adjacent two sides of the sealing member 4. Further, the first output electrode 51 and the second output electrode 52 may be provided at a corner of the sealing member 4. Alternatively, the first output electrode 51 may be provided at a corner of the sealing member 4 and the second output electrode 52 may be provided at the center of the sealing member 4. When a plurality of the output electrodes 5 are provided, the area of the plurality of output electrodes 5 may not be equal and may be defined as desired in view of structural members of the first and second electrodes that are electrically connected.

Further, in the above exemplary embodiment, a light diffusion layer may be provided on all or a part of the surface of the substrate 2 facing the outside of the photoelectric conversion device. Thus, the light emitted from the organic compound layer 33 of the organic EL device 3 can be efficiently extracted to the outside in the light-extraction direction. The light-diffusion layer is provided by adhering a light-diffusion film or by a vapor deposition.

Further, though the anode 31 and the cathode 32 are extended to the end of the substrate 2 in the fifth exemplary embodiment (see FIG. 12), the above-described substrate conductive member may be formed between the anode 31 (cathode 32) and the substrate 2 near the end of the substrate after the anode 31 and the cathode 32 are extended near to the end of the substrate 2.

EXAMPLES

Next, the present invention will be described in further detail by exemplifying Example(s). However, the present invention is not limited by the description of Example(s).

In the Example, the photoelectric conversion device 1 was produced according to the arrangement of the first exemplary embodiment, a drive test therefor was performed and the photoelectric conversion device 1 was examined. The evaluation was conducted for the following items.

(i) Current-luminance characteristics: basic characteristics for an illumination panel were evaluated.
(ii) Current-voltage characteristics (J-V characteristics): drive stability of an electrical connecting portion was evaluated.
(iii) Luminous area: a ratio of an emitting area within a device area of the photoelectric conversion device in a plan view was evaluated. This ratio represents a degree of narrow bezel structure when being emitted.
(iv) Device lifetime: a time elapsed before falling to half of an original luminance was evaluated. This half-life represents a sealing performance of the photoelectric conversion device.

The drive test was performed according to the following conditions.

A voltage was applied on the organic EL device 3 such that a current value became 1 mA/cm$^2$, where a value of the voltage at that time was measured. EL emission spectra were measured with a spectral radiance meter (CS-1000, manufactured by KONICA MINOLTA). Luminance, chromaticity, current efficiency (cd/A), external quantum efficiency (%), and main peak wavelength (nm) were calculated from the obtained spectral-radiance spectra. Moreover, the organic electroluminescence devices were tested by a continuous current test under direct-current with the initial luminance intensity of 5000 cd/m$^2$ (nit), where time until half-life was measured for the organic electroluminescence device.

The structure and components of the photoelectric conversion device used for the drive test were as follows.

Substrate: blue sheet glass (100 mm×100 mm, thickness: 0.7 mm)

Sealing member: soda glass (99.95 mm×100 mm, thickness: 0.7 mm)

Output electrode: copper foil (thickness: 0.08 mm)

Bonding member: flitted glass (manufactured by ASAHI GLASS CO., LTD., AP5346B, melting point 485 degrees C.)

Electrical connecting member: solder material (manufactured by Ishikawa Metal Co., LTD., J3-3230-LU, melting point 300 degrees C.)

Heat-radiation member: fluorinated oil (manufactured by DAIKIN INDUSTRIES, ltd., DEMNUM grease S-200)

auxiliary electrode, substrate conductive member: APC

Arrangement of Organic EL Device: anode (ITO, thickness: 100 nm)/NPD (thickness: 50 nm)/Alq (thickness: 60 nm)/LiF (thickness: 1 nm)/cathode (Al, thickness: 100 nm)

NPD was provided as a hole transporting layer, Alq was provided as an emitting layer and LiF was provided as an electron-injecting electrode (cathode).

Width of bonding member: 0.7 mm

Distance from an end of the substrate to the bonding member: 0.2 mm

Width of substrate conductive member: 20 mm

The performance of the photoelectric conversion device manufactured according to the arrangement of the first exemplary embodiment was as follows.

The organic EL device provided in the photoelectric conversion device was as follows:
luminance: 305 cd/m$^2$
current efficiency (cd/A): 3.0 cd/A
main peak wavelength (nm): 535 nm Further, it was found that the properties required for a photoelectric conversion device for an illumination panel (current-luminance characteristics, current-voltage characteristics, luminous area and device lifetime) were sufficiently satisfied.

Especially, the luminous area accounted for approximately 96% without unevenness. Thus, a photoelectric conversion device with a narrow bezel structure could be obtained.

The invention claimed is:

1. A photoelectric conversion device comprising:
a substrate comprising a first side surface, a first surface and a second surface that is on an opposite side of the first surface;
a photoelectric conversion element located on the first surface of the substrate and comprising an anode, an organic compound layer, and a cathode that are layered in this order in a first direction, which is defined as a direction from the second surface of the substrate toward the first surface of the substrate;
a sealing member located above the substrate and the photoelectric conversion element in the first direction, and comprising a second side surface, a third surface, which faces the photoelectric conversion element, and a fourth surface, which is on an opposite side of the third surface and on which one or more electrodes are provided;
a bonding member provided to bond the substrate and the sealing member to each other, and located at an outside of the organic compound layer away from an edge of the first surface of the substrate; and
a substrate conductive member located on the first surface of the substrate, electrically connected to at least one of the anode and the cathode of the photoelectric conversion element, and extending under the bonding member toward the edge of the first surface of the substrate,
wherein at least one of the one or more electrodes comprises an extending portion that extends outward from an edge of the sealing member and a side conductive portion that is located on the second side surface of the sealing member, the extending portion being electrically connected to the substrate conductive member via the side conductive portion, and
wherein an electrical connecting member that is located at an outside of the bonding member electrically connects the side conductive portion to the substrate conductive member.

2. The photoelectric conversion device according to claim 1, wherein
the side conductive portion is located outside an end of the sealing member, and
the electrical connecting member is located at an inside of the side conductive portion and at the outside of the bonding member, the electrical connecting member being electrically connected with the substrate conductive member and being electrically connected with the inside of the side conductive portion in a second direction parallel to the surface of the substrate.

3. The photoelectric conversion device according to claim 2, wherein the at least one of the one or more electrodes is integrated with the side conductive portion.

4. The photoelectric conversion device according to claim 2, wherein the side conductive portion is a member independent of the at least one of the one or more electrodes.

5. The photoelectric conversion device according to claim 1, wherein
the side conductive portion is located outside the end of the sealing member, and
the electrical connecting member is located between the substrate conductive member and the side conductive portion, the electrical connecting member being electrically connected with the substrate conductive member and being electrically connected with the side conductive portion.

6. The photoelectric conversion device according to claim 5, wherein the at least one of the one or more electrodes is integrated with the side conductive portion.

7. The photoelectric conversion device according to claim 5, wherein the side conductive portion is a member independent of the at least one of the one or more electrodes.

8. A photoelectric conversion device comprising:
a substrate comprising a first side surface, a first surface and a second surface that is on an opposite side of the first surface;
a photoelectric conversion element located on the first surface of the substrate and comprising an anode, an organic compound layer, and a cathode that are layered in this order in a first direction, which is defined as a direction from the second surface of the substrate toward the first surface of the substrate;
a sealing member located above the substrate and the photoelectric conversion element in the first direction, and comprising a second side surface, a third surface which faces the photoelectric conversion element, and a fourth surface, which is on an opposite side of the third surface and on which one or more electrodes are provided
a bonding member provided to bond the substrate and the sealing member to each other, and located at an outside of the organic compound layer away from an edge of the first surface of the substrate; and
a substrate conductive member located on the first surface of the substrate, electrically connected to at least one of the anode and the cathode of the photoelectric conversion element and extending under the bonding member toward the edge of the first surface of the substrate;
wherein at least one of the one or more electrodes comprises an extending portion which extends outward from an edge of the sealing member and a side conductive portion, which is located on the second side surface of the sealing member, the extending portion being electrically connected to the substrate conductive member via the side conductive portion,
the side conductive portion being electrically connected with the substrate conductive member at an outside of the bonding member.

9. The photoelectric conversion device according to claim 1, wherein at least one of the anode and the cathode is integrated with the substrate conductive member.

10. The photoelectric conversion device according to claim 1, wherein
the sealing member is an electrically conductive member, and
an insulative portion is provided between the sealing member and the at least one of the one or more electrodes.

11. The photoelectric conversion device according to claim 1, wherein an insulation film is located on the substrate conductive member.

12. The photoelectric conversion device according to claim 1, wherein a light-reflecting portion is located on the substrate at a region different from a region at which the substrate conductive member and the photoelectric conversion element are located.

13. The photoelectric conversion device according to claim 12, wherein the light-reflecting portion is integrated with the substrate conductive member.

14. The photoelectric conversion device according to claim 8, wherein at least one of the anode and the cathode is integrated with the substrate conductive member.

15. The photoelectric conversion device according to claim 8, wherein
the sealing member is an electrically conductive member, and
an insulative portion is located between the sealing member and the at least one of the one or more electrodes.

16. The photoelectric conversion device according to claim 8, wherein an insulation film is located on the substrate conductive member.

17. The photoelectric conversion device according to claim 8, wherein a light-reflecting portion is located on the substrate at a region different from a region at which the substrate conductive member and the photoelectric conversion element are located.

18. The photoelectric conversion device according to claim 17, wherein the light-reflecting portion is integrated with the substrate conductive member.

19. The photoelectric conversion device according to claim 1, wherein the substrate is a light-transmissive member having a transmissivity of 50% or more of light in a visible region of 400 nm to 700 nm.

20. The photoelectric conversion device according to claim 8, wherein the substrate is a light-transmissive member having a transmissivity of 50% or more of light in a visible region of 400 nm to 700 nm.

* * * * *